United States Patent
Moen et al.

(10) Patent No.: US 10,347,625 B2
(45) Date of Patent: Jul. 9, 2019

(54) LINEARITY AND LATERAL ISOLATION IN A BICMOS PROCESS THROUGH COUNTER-DOPING OF EPITAXIAL SILICON REGION

(71) Applicant: Newport Fab, LLC, Newport Beach, CA (US)

(72) Inventors: Kurt A. Moen, Tustin, CA (US); Edward J. Preisler, San Clemente, CA (US); Paul D. Hurwitz, Irvine, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 16/147,345

(22) Filed: Sep. 28, 2018

(65) Prior Publication Data
US 2019/0043855 A1    Feb. 7, 2019

Related U.S. Application Data

(62) Division of application No. 15/588,011, filed on May 5, 2017.

(51) Int. Cl.
*H01L 27/06* (2006.01)
*H01L 29/06* (2006.01)
(Continued)

(52) U.S. Cl.
CPC .... *H01L 27/0623* (2013.01); *H01L 21/76229* (2013.01); *H01L 21/8249* (2013.01);
(Continued)

(58) Field of Classification Search
CPC ............ H01L 27/0623; H01L 21/761
(Continued)

(56) References Cited

U.S. PATENT DOCUMENTS

| 5,356,821 A | * | 10/1994 | Naruse | ............... H01L 21/8248 |
| | | | | 148/DIG. 9 |
| 6,649,982 B2 | * | 11/2003 | Pan | .................... H01L 21/8249 |
| | | | | 257/370 |

(Continued)

OTHER PUBLICATIONS

C.-W. P. Huang, J. Soricelli, L. Lam, M. Doherty, P. Antognetti, and W. Vaillancourt, "Novel silicon-on-insulator SP5T switch-LNA front-end IC enabling concurrent dual-band 256-QAM 802.11ac WLAN radio operations," in RFIC Symposium, 2013, pp. 133-136.

(Continued)

*Primary Examiner* — Jami Valentine Miller
(74) *Attorney, Agent, or Firm* — Bever, Hoffman & Harms, LLP

(57) ABSTRACT

Methods for providing improved isolation structures in a SiGe BiCMOS process are provided. In one method, an n-type epitaxial layer is grown over a p-type high-resistivity substrate. A mask covers a first region, and exposes a second region, of the epitaxial layer. A p-type impurity is implanted through the mask, counter-doping the second region to become slightly p-type. Shallow trench isolation and optional deep trench isolation regions are formed through the counter-doped second region, providing an isolation structure. The first region of the epitaxial layer forms a collector region of a heterojunction bipolar transistor. In another method, shallow trenches are etched partially into the epitaxial layer through a mask. A p-type impurity is implanted through the mask, thereby counter-doping thin exposed regions of the epitaxial layer to become slightly p-type. The shallow trenches are filled with dielectric material and a CMP process is performed to form shallow trench isolation regions.

21 Claims, 16 Drawing Sheets

(51) Int. Cl.
*H01L 21/8249* (2006.01)
*H01L 29/66* (2006.01)
*H01L 29/161* (2006.01)
*H01L 29/737* (2006.01)
*H01L 21/762* (2006.01)
*H01L 21/8238* (2006.01)

(52) U.S. Cl.
CPC ........ *H01L 29/0649* (2013.01); *H01L 29/161* (2013.01); *H01L 29/66242* (2013.01); *H01L 29/7371* (2013.01); *H01L 21/823878* (2013.01); *H01L 21/823892* (2013.01); *H01L 29/66272* (2013.01)

(58) Field of Classification Search
USPC ........................................................ 257/197
See application file for complete search history.

(56) References Cited

U.S. PATENT DOCUMENTS

| | | | | |
|---|---|---|---|---|
| 7,242,071 | B1* | 7/2007 | Liu | H01L 21/82389 257/506 |
| 7,304,354 | B2* | 12/2007 | Morris | H01L 21/761 257/372 |
| 7,335,545 | B2* | 2/2008 | Currie | H01L 21/76254 257/E21.121 |
| 7,816,236 | B2* | 10/2010 | Bauer | C23C 16/04 438/478 |
| 7,859,009 | B1* | 12/2010 | Kerr | H01L 29/1045 257/104 |
| 8,252,642 | B2* | 8/2012 | Morris | H01L 29/1087 257/E29.064 |
| 2001/0031521 | A1* | 10/2001 | Pan | H01L 21/8249 438/197 |
| 2002/0056879 | A1* | 5/2002 | Wieczorek | H01L 23/485 257/368 |
| 2003/0094673 | A1* | 5/2003 | Dunn | H01L 21/8249 257/566 |
| 2003/0168701 | A1* | 9/2003 | Voldman | H01L 27/0255 257/355 |
| 2004/0188797 | A1* | 9/2004 | Khater | H01L 29/66242 257/510 |
| 2004/0195587 | A1* | 10/2004 | Tsai | H01L 29/1004 257/197 |
| 2007/0215978 | A1* | 9/2007 | Stricker | H01L 29/0821 257/565 |
| 2008/0213972 | A1* | 9/2008 | Disney | H01L 21/761 438/430 |
| 2010/0127318 | A1* | 5/2010 | Noort | H01L 27/0623 257/316 |
| 2011/0180689 | A1* | 7/2011 | Roy | H01L 27/14603 250/208.1 |
| 2014/0061804 | A1* | 3/2014 | Kamoshita | H01L 21/823481 257/365 |
| 2014/0367777 | A1* | 12/2014 | Huang | H01L 21/76251 257/337 |
| 2016/0211290 | A1* | 7/2016 | Tsai | H01L 27/1464 |
| 2016/0307941 | A1* | 10/2016 | Cheng | H01L 27/1463 |
| 2017/0092684 | A1* | 3/2017 | Chang | H01L 27/14645 |
| 2018/0102442 | A1* | 4/2018 | Wang | H04B 10/691 |

OTHER PUBLICATIONS

Kurt A. Moen, Edward Preisler, Paul Hurwitz, Jie Zheng, and Warren McArthur, "Recent Improvements in SBC18 for Fully-Integrated Front-End ICs," pp. 1-7.

* cited by examiner

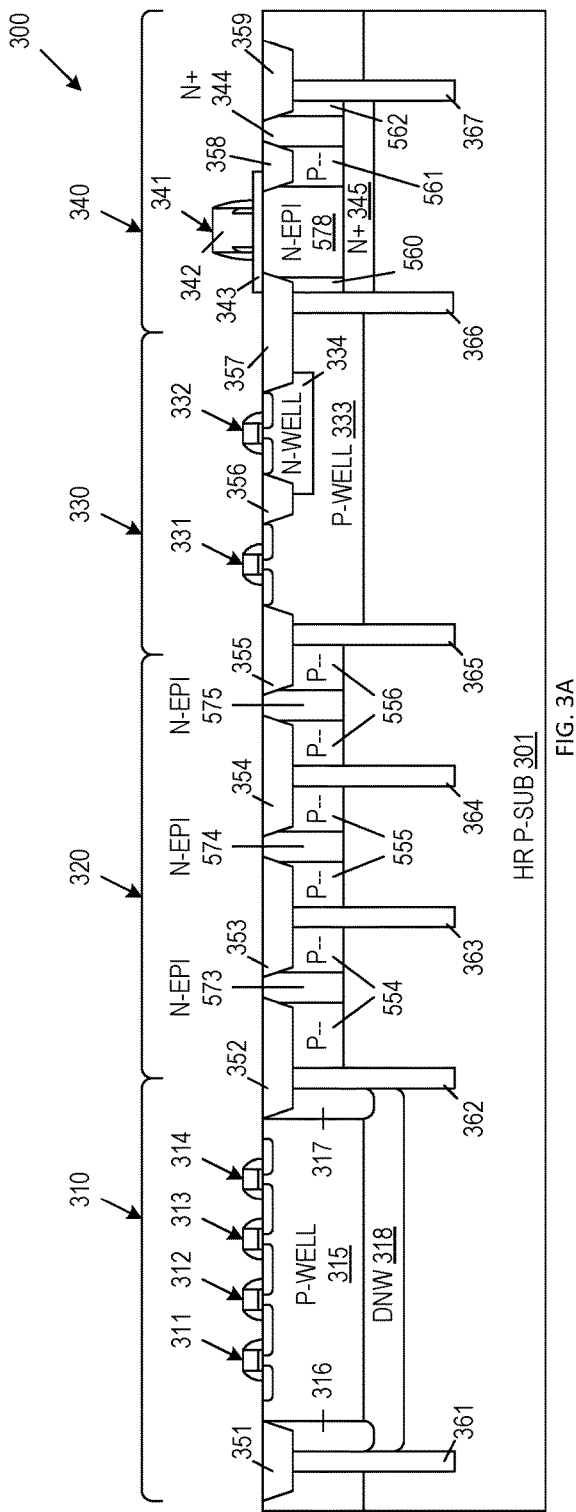
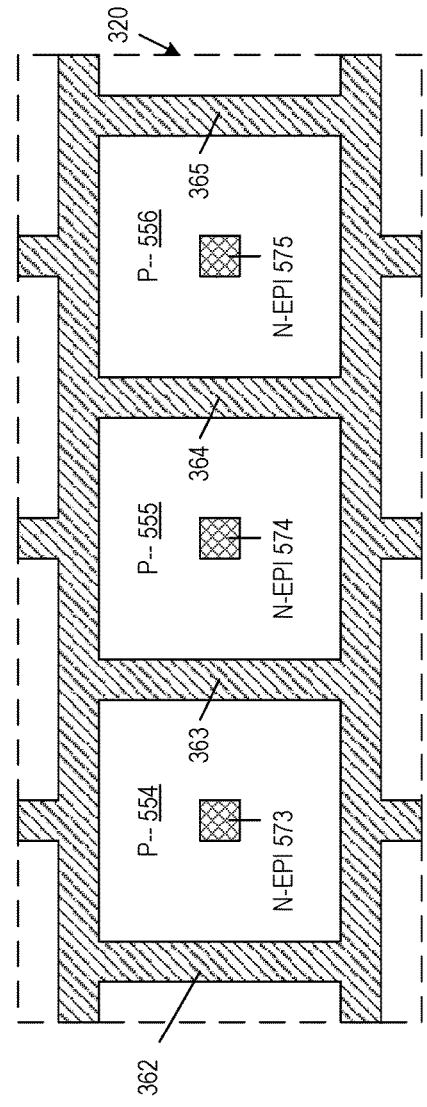
FIG. 3A
FIG. 3B

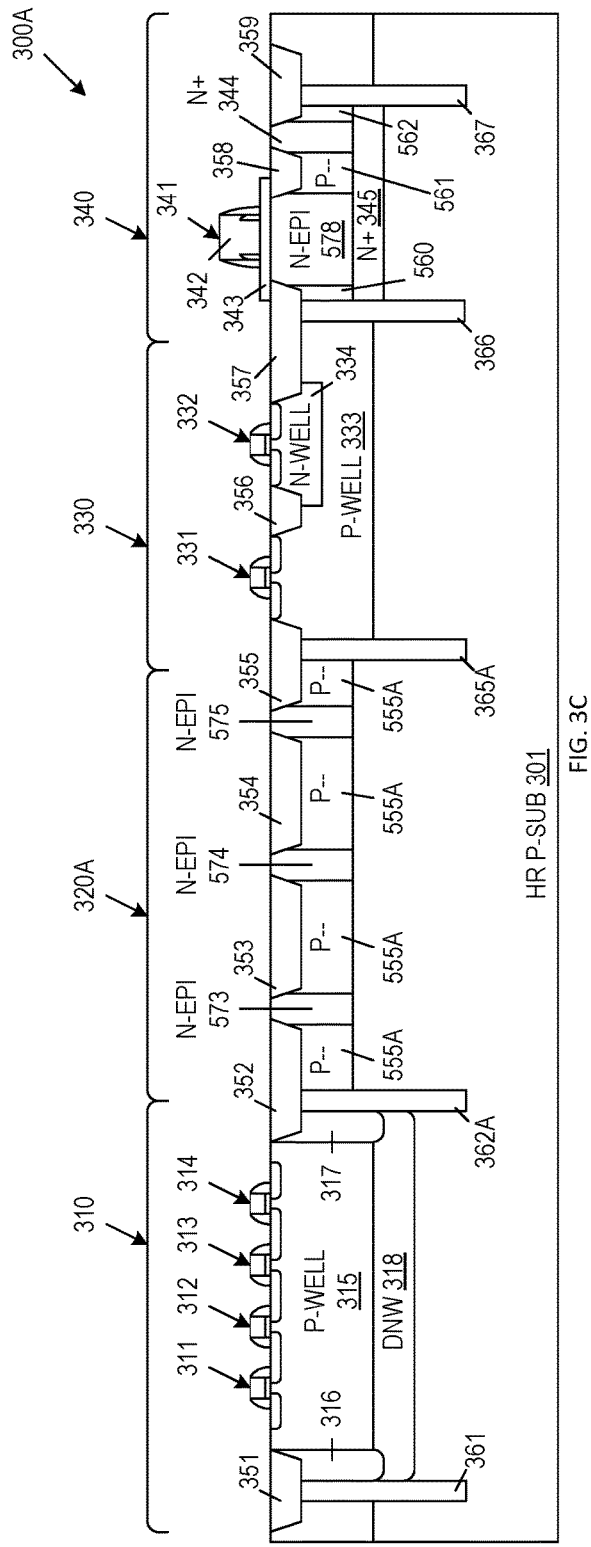

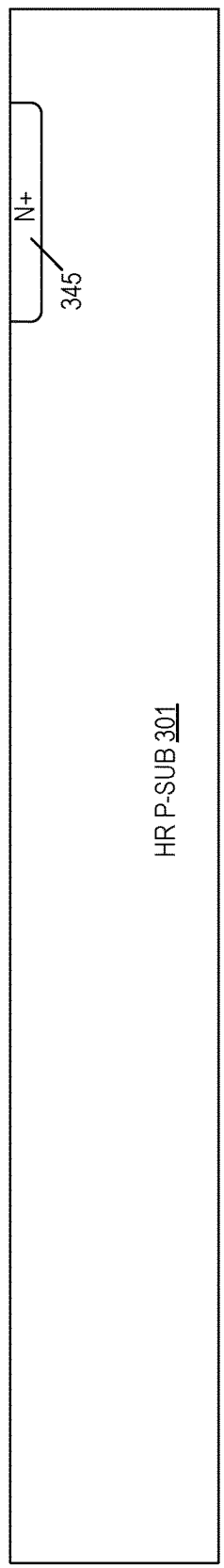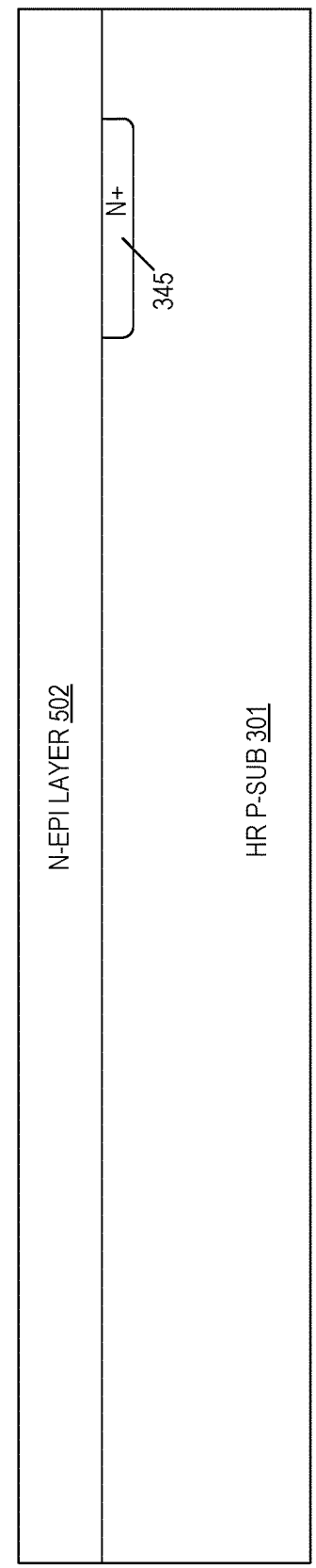
FIG. 5A
FIG. 5B

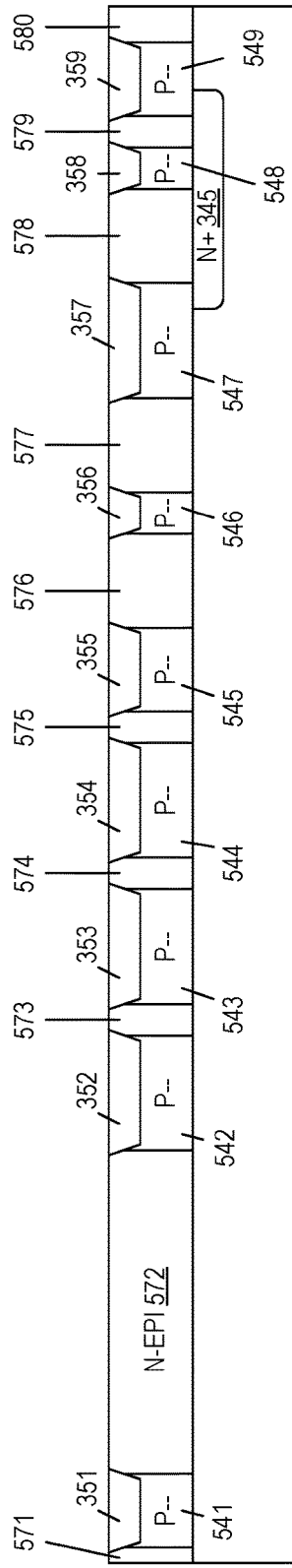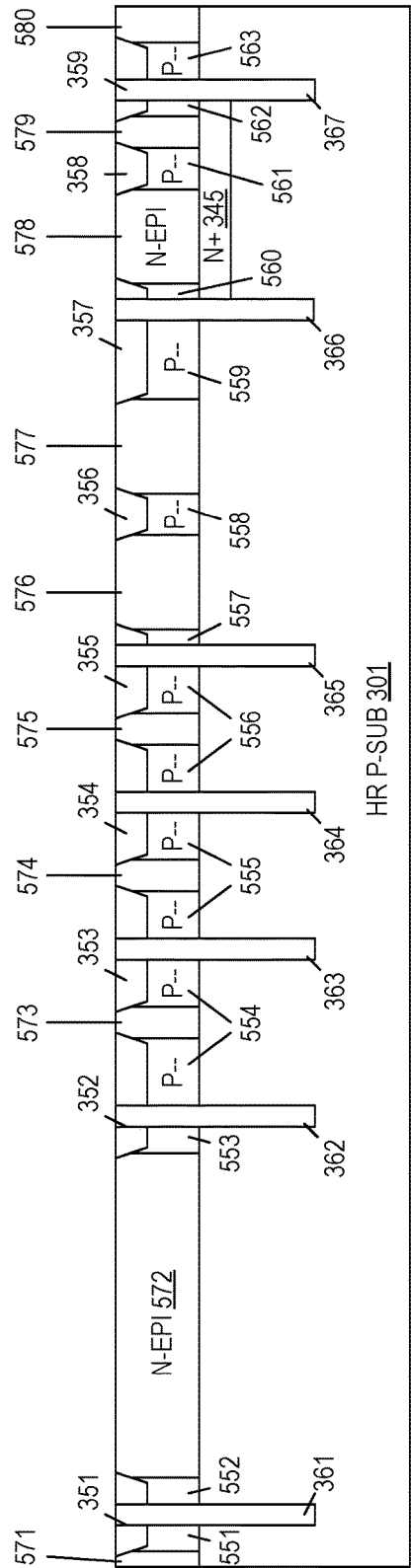

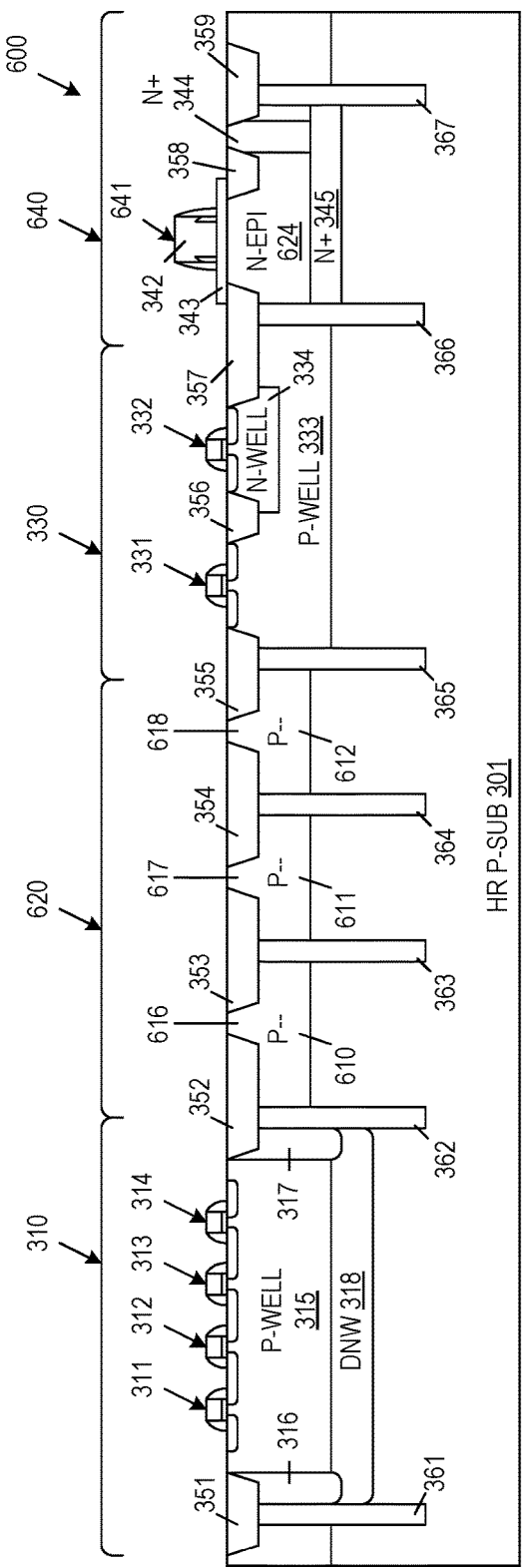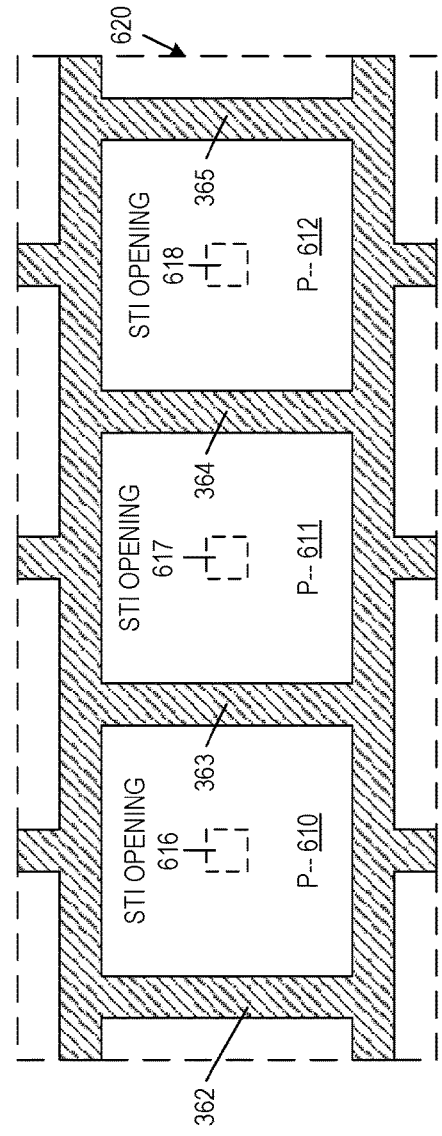
FIG. 6A
FIG. 6B

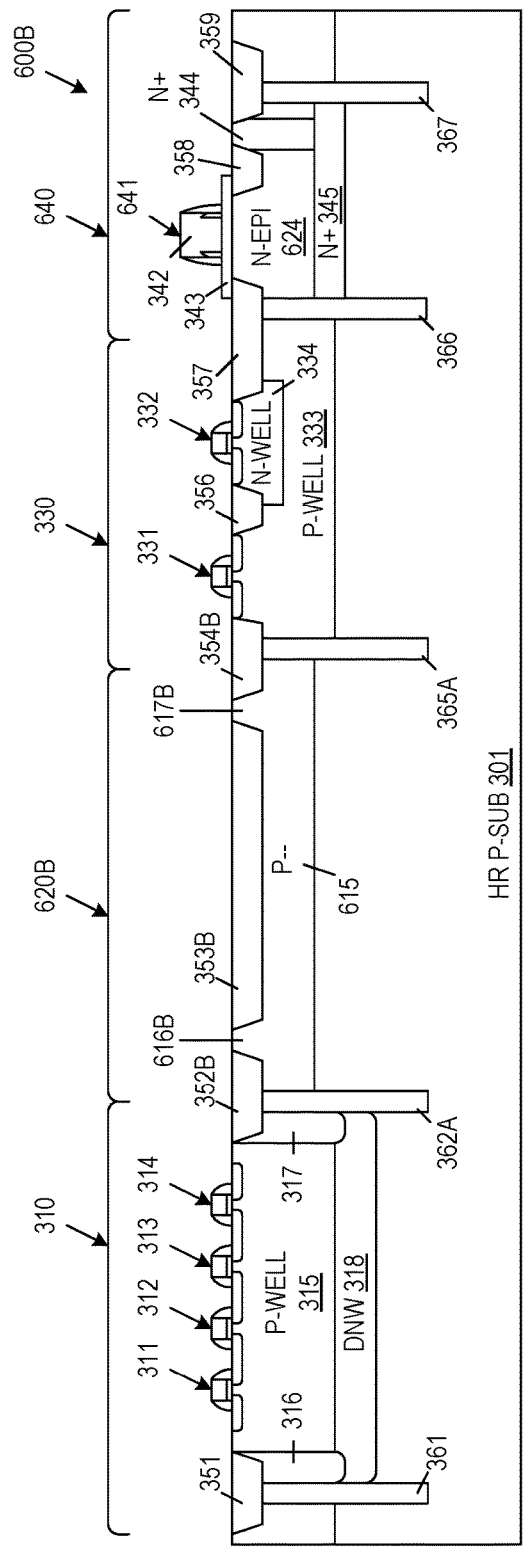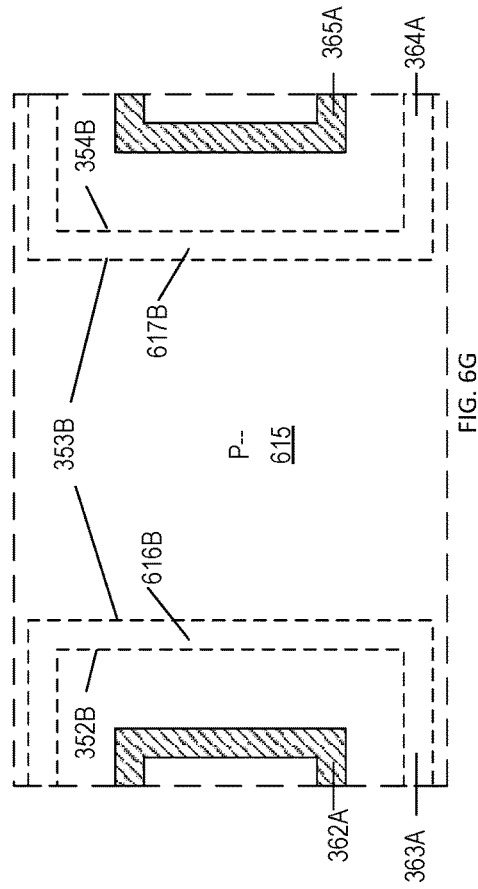
FIG. 6F
FIG. 6G

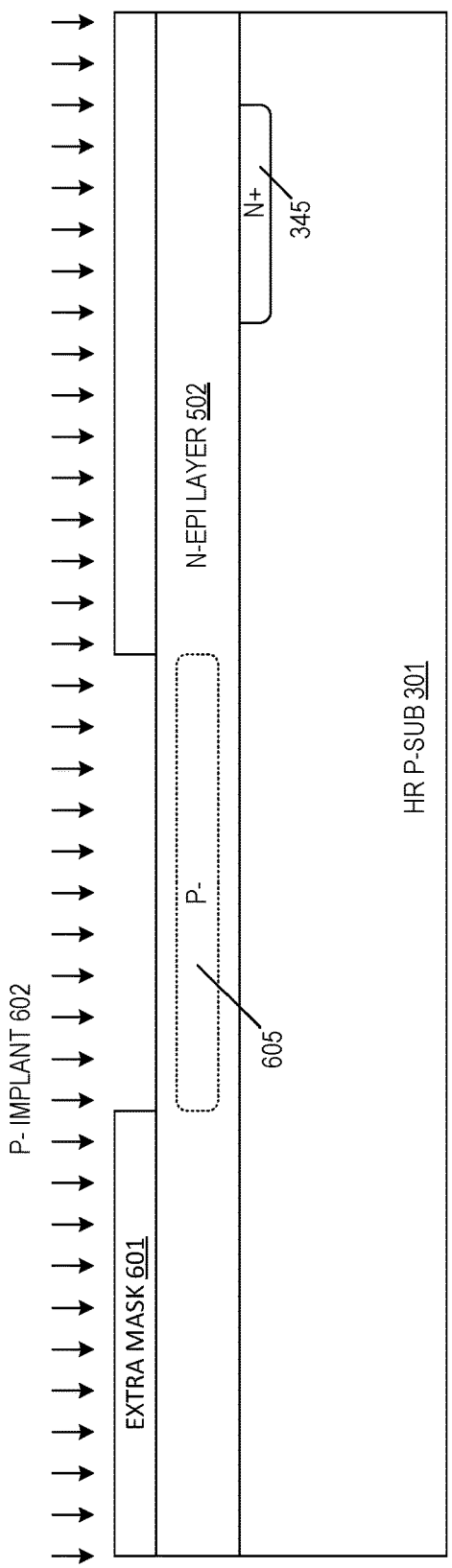
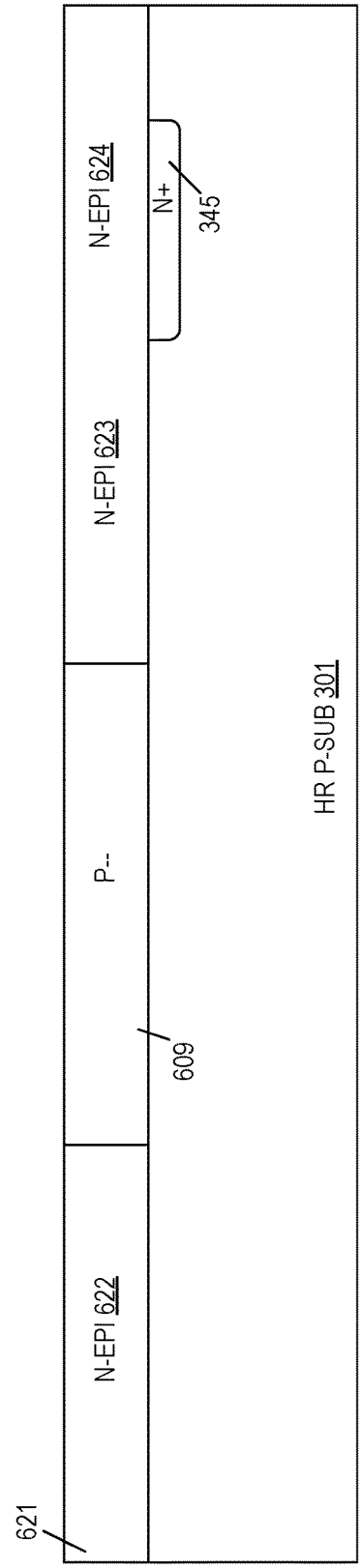
FIG. 7A
ACTIVATE IMPURITIES
TO FORM P-- REGION
FIG. 7B

LINEARITY AND LATERAL ISOLATION IN A BICMOS PROCESS THROUGH COUNTER-DOPING OF EPITAXIAL SILICON REGION

RELATED APPLICATION

The present application is a divisional of U.S. patent application Ser. No. 15/588,011 entitled "Improved Linearity And Lateral Isolation In A BiCMOS Process Through Counter-Doping Of Epitaxial Silicon Region", filed on May 5, 2017.

FIELD OF THE INVENTION

The present invention relates to an improved silicon-germanium (SiGe) bipolar complementary metal oxide silicon (BiCMOS) process, and structures formed using the same. More specifically, the present invention relates to counter-doping an epitaxial layer in an SiGe BiCMOS process in order to improve performance of devices fabricated using this process.

RELATED ART

FIG. 1 is a block diagram of a conventional dual-band wireless communication device 100 that includes antenna 101, diplexer 102, front end module (FEM) 110 and wireless transceiver 130. Front end module 110 includes radio frequency (RF) switches 111-112, low-noise amplifiers (LNAs) 113-114, power amplifiers 115-116, output impedance matching networks (OMNs) 117-118 and bias/control circuits 121-123. Wireless transceiver 130 includes a Bluetooth port 131, 2.4 GHz receive port 132, a 2.4 GHz transmit port 133, a 5 GHz transmit port 134 and a 5 GHz receive port 135. RF switch 111 has a first position that couples antenna 101 to Bluetooth port 131, a second position that couples antenna 101 to the 2.4 GHz receive port 132 (through LNA 113) and a third position that couples antenna 101 to the 2.4 GHz transmit port 133 (through power amplifier 115 and OMN 117). RF switch 112 has a first position that couples antenna 101 to the 5 GHz transmit port 134 (through power amplifier 116 and OMN 118) and a second position that couples antenna 101 to the 5 GHz receive port 135 (through LNA 114). LNAs 113 and 114 are controlled by bias/control circuits 121-122, respectively. Power amplifiers 115-116 are controlled by bias/control circuit 123.

It is desirable for all of the elements of FEM 110 to be integrated on a single chip in order to reduce system size, cost and complexity. However, this is difficult to accomplish due to the cost and performance requirements of the different elements of FEM 110. For example, while a silicon-on-insulator (SOI) CMOS process technology allows for the fabrication of CMOS FETS that are well suited to implement RF switches 111-112, LNAs 113-114 and the digital bias/control circuits 121-123, these CMOS FETs are not capable of adequately implementing power amplifiers 115-116. Conversely, a process technology that is well suited for the fabrication of power amplifiers 115-116 is not optimal for fabricating RF switches 111-112, LNAs 113-114 and bias/control circuits 121-123. As a result, FEM 110 is typically implemented as a multi-chip module that combines a plurality of integrated circuits fabricated using different process technologies.

SiGe BiCMOS process technology has been used to achieve higher levels of integration for FEM 110. Hetero-junction bipolar transistors (HBTs) fabricated using a SiGe BiCMOS process are well suited for implementing the power amplifiers 115-116 of FEM 110. The SiGe BiCMOS process also allows for the fabrication of CMOS transistors and passive devices (e.g., metal-insulator-metal (MIM) devices) that can be used to implement RF switches 111-112, LNAs 113-114, OMNs 117-118 and bias/control circuits 121-123. As a result, the entire FEM 110 can be integrated on a single chip.

As illustrated in FIG. 1, the RF switches 111-112 are in the signal path between the antenna 101 and the LNAs 113-114 and power amplifiers 115-116. RF signal propagation to the semiconductor substrate will degrade all metrics of the RF switches 111-112. More specifically, parasitic coupling to the substrate will: (a) increase insertion loss of the RF switches 111-112 (thereby reducing power transmitted to the antenna 101 and received at ports 132 and 135); (b) reduce isolation of the RF switches 111-112; (c) degrade the linearity of the RF switches; and (d) reduce the power handling capabilities of the RF switches 111-112 (by introducing voltage imbalances across the series-connected CMOS transistors of the RF switches 111-112).

A high-resistivity substrate has been used with the SiGe BiCMOS process to reduce substrate losses associated with RF switches 111-112 (and passive devices) fabricated on the same chip as the SiGe HBTs. FIGS. 2A and 2B are cross sectional views of a multi-finger field effect transistor 111A used to implement the RF switch 111 of FEM 110, when fabricated in accordance with a conventional SiGe BiCMOS process on a high-resistivity (HR) p-type substrate 201. High-resistivity substrate 201 is monocrystalline silicon having a resistivity that is typically greater than 500 $\Omega$-cm.

RF switch 111 includes a plurality of series-connected n-channel FET transistors 211-214, which are fabricated in a p-well region 215. P-well region 215 is laterally bounded by n-type regions 216-217. A deep n-well (DNW) 220 is located below p-well region 215 (and is continuous with n-type regions 216-217). Shallow trench isolation (STI) regions 231-235 and deep trench isolation (DTI) regions 241-242 provide electrical isolation to RF switch 111 (and other circuit elements fabricated in high-resistivity substrate 201). The high-resistivity substrate 201 provides high-impedance paths 251-252, which reduce substrate losses.

However, as illustrated in FIGS. 2A and 2B, certain semiconductor regions located adjacent to RF switch 111 provide low resistance paths 253 and 254 near the upper surface of the substrate 201.

For example, as illustrated by FIG. 2A, a p-well region 260 (formed at the same time as p-well region 215 during the SiGe BiCMOS process) may be located at the upper surface of the substrate 201. Note that other CMOS transistors (not shown) may be fabricated in the p-well region 260, or p-well region 260 may simply represent a region that exists between devices. P-well region 260 provides a low resistance current path 253 at the upper surface of the substrate, which undesirably increases substrate losses, and degrades the performance of RF switch 111 in the manner described above. For example, p-well region 260 may have a resistivity of about 0.1 $\Omega$-cm (corresponding to a lateral sheet resistance of about 1 K$\Omega$/square), which is significantly lower than the resistivity of substrate 201. The dashed line in FIG. 2A illustrates a current path associated with the substrate losses.

As illustrated by FIG. 2B, an n-type epitaxial layer 270, (which is used to form collector regions of NPN SiGe HBTs fabricated on substrate 201 in accordance with the SiGe BiCMOS process) may be located at the upper surface of the substrate. Note that this n-type epitaxial layer 270 may represent an inactive region that exists between devices. N-type epitaxial layer 270 provides a low resistance path 254 at the upper surface of the substrate, which undesirably increases substrate losses, and degrades the performance of RF switch 111 in the manner described above. For example, n-type epitaxial layer 270 may have a resistivity of about 0.4 $\Omega$-cm (corresponding to a lateral sheet resistance of about 4 K$\Omega$/square), which is significantly lower than the resistivity of HR substrate 201. The dashed line in FIG. 2B illustrates a current path associated with the substrate losses. In addition, the non-linear p-n junction that exists between HR substrate 201 and n-type epitaxial layer 270 can contribute significantly to total RF circuit non-linearity (including adding non-linearity to the operation of RF switch 111).

It would therefore be desirable to have an improved structure and method for isolating devices in an integrated FEM fabricated using a SiGe BiCMOS process. It would be further desirable for such a structure and method to reduce substrate losses and eliminate non-linearities present in conventional structures.

SUMMARY

Accordingly, the present invention provides a modified SiGe BiCMOS process, wherein low-resistance paths near the surface of a high-resistivity substrate are minimized or eliminated, and wherein non-linear p-n junctions are minimized or eliminated in isolation regions near the surface of the high-resistivity substrate. In general, the modified SiGe BiCMOS process includes one or more steps for counter-doping an epitaxial layer formed over the high-resistance substrate.

In accordance with one embodiment, the modified SiGe BiCMOS process includes growing an epitaxial layer over a high-resistivity semiconductor substrate, wherein the semiconductor substrate has a first conductivity type and the epitaxial layer has a second conductivity type, opposite the first conductivity type. A mask is formed over the epitaxial layer, wherein the mask covers a first region of the epitaxial layer and exposes a second region of the epitaxial layer. A dopant having the first conductivity type is implanted through the mask into the second region of the epitaxial layer, whereby the second region of the epitaxial layer becomes counter-doped to the first conductivity type. One or more shallow trench isolation regions are formed in the counter-doped second region of the epitaxial layer. One or more deep trench isolation regions may also be formed through the counter-doped second region of the epitaxial layer. The counter-doped second region, the shallow trench isolation regions and the deep trench isolation regions form an isolation region that electrically isolates various devices fabricated on the substrate. In addition, a heterojunction bipolar transistor is fabricated in the semiconductor substrate, wherein a portion of the first region of the epitaxial layer forms a collector region of the heterojunction bipolar transistor.

In an alternate embodiment, the modified SiGe BiCMOS process includes growing an epitaxial layer over a high-resistivity semiconductor substrate, wherein the semiconductor substrate has a first conductivity type and the epitaxial layer has a second conductivity type, opposite the first conductivity type. A mask is formed over the epitaxial layer, wherein the mask includes openings that define locations of shallow trench isolation regions to be formed. The epitaxial layer is etched through the openings in the mask, thereby creating a plurality of shallow trenches, wherein thinned portions of the epitaxial layer remain below the shallow trenches. A dopant having the first conductivity type is implanted through the mask into the thinned portions of the epitaxial layer, whereby the thinned portions of the epitaxial layer are counter-doped to the first conductivity type. The portions of the epitaxial layer that are covered by the mask are not counter-doped. After the counter-doping is performed, the shallow trenches are filled with a dielectric material, thereby forming shallow trench isolation regions. Deep trench isolation regions may be formed after the shallow trench isolation regions are formed, wherein the deep trench isolation regions, the shallow trench isolation regions and the counter-doped thinned portions of the epitaxial layer form an isolation region that electrically isolates various devices fabricated on the substrate. In addition, a heterojunction bipolar transistor may be fabricated in the semiconductor substrate, wherein a portion of the epitaxial layer that is not counter-doped forms a collector region of the heterojunction bipolar transistor.

In accordance with another embodiment, the present invention includes a semiconductor structure having a first conductivity type and an epitaxial region formed over the semiconductor substrate, wherein the epitaxial region has a second conductivity type, opposite the first conductivity type. The epitaxial region forms a collector region of a heterojunction bipolar transistor, which may be used to form a power amplifier of the semiconductor structure. An isolation region is formed on the semiconductor substrate, wherein the isolation region includes: one or more shallow trench isolation regions, one or more deep trench isolation regions, and one or more lightly doped regions of the first conductivity type, wherein the one or more lightly doped regions have a sheet resistance of at least about 50 K$\Omega$/square.

The present invention will be more fully understood in view of the following description and drawings.

BRIEF DESCRIPTION OF THE DRAWINGS

FIG. 3A is a cross sectional representation of a semiconductor structure fabricated using a modified SiGe BiCMOS process in accordance with one embodiment of the present invention.

FIG. 3B is a top view of a portion of an isolation region of the semiconductor structure of FIG. 3A in accordance with one embodiment of the present invention.

FIG. 3C is a cross sectional representation of a semiconductor structure fabricated using a modified SiGe BiCMOS process in accordance with an alternate embodiment of the present invention.

FIG. 3D is a top view of a portion of an isolation region of the semiconductor structure of FIG. 3C in accordance with one embodiment of the present invention.

FIGS. 5A, 5B, 5C, 5D, 5E, 5F and 5G are cross sectional views of the semiconductor structure of FIGS. 3A and 3B, during various stages of the modified SiGe BiCMOS process of the present invention.

FIG. 6A is a cross sectional representation of a semiconductor structure fabricated using a modified SiGe BiCMOS process in accordance with an alternate embodiment of the present invention.

FIG. 6B is a top view of a portion of an isolation region of the semiconductor structure of FIG. 6A in accordance with one embodiment of the present invention.

FIG. 6F is a cross sectional representation of a semiconductor structure fabricated using a modified SiGe BiCMOS process in accordance with another embodiment of the present invention.

FIG. 6G is a top view of a portion of an isolation region of the semiconductor structure of FIG. 3F in accordance with one embodiment of the present invention.

FIGS. 7A, 7B, 7C and 7D are cross sectional views of the semiconductor structure of FIGS. 6A and 6B, during various stages of the modified SiGe BiCMOS process of the present invention.

DETAILED DESCRIPTION

In general, the present invention uses a high-isolation layout and an implantation step to counter-dope an epitaxial layer formed over a high-resistivity substrate, thereby largely mitigating the parasitic low-impedance path normally provided by the epitaxial layer, effectively restoring the benefits of the high-resistivity substrate. The present invention will now be described in more detail.

Figure 1:
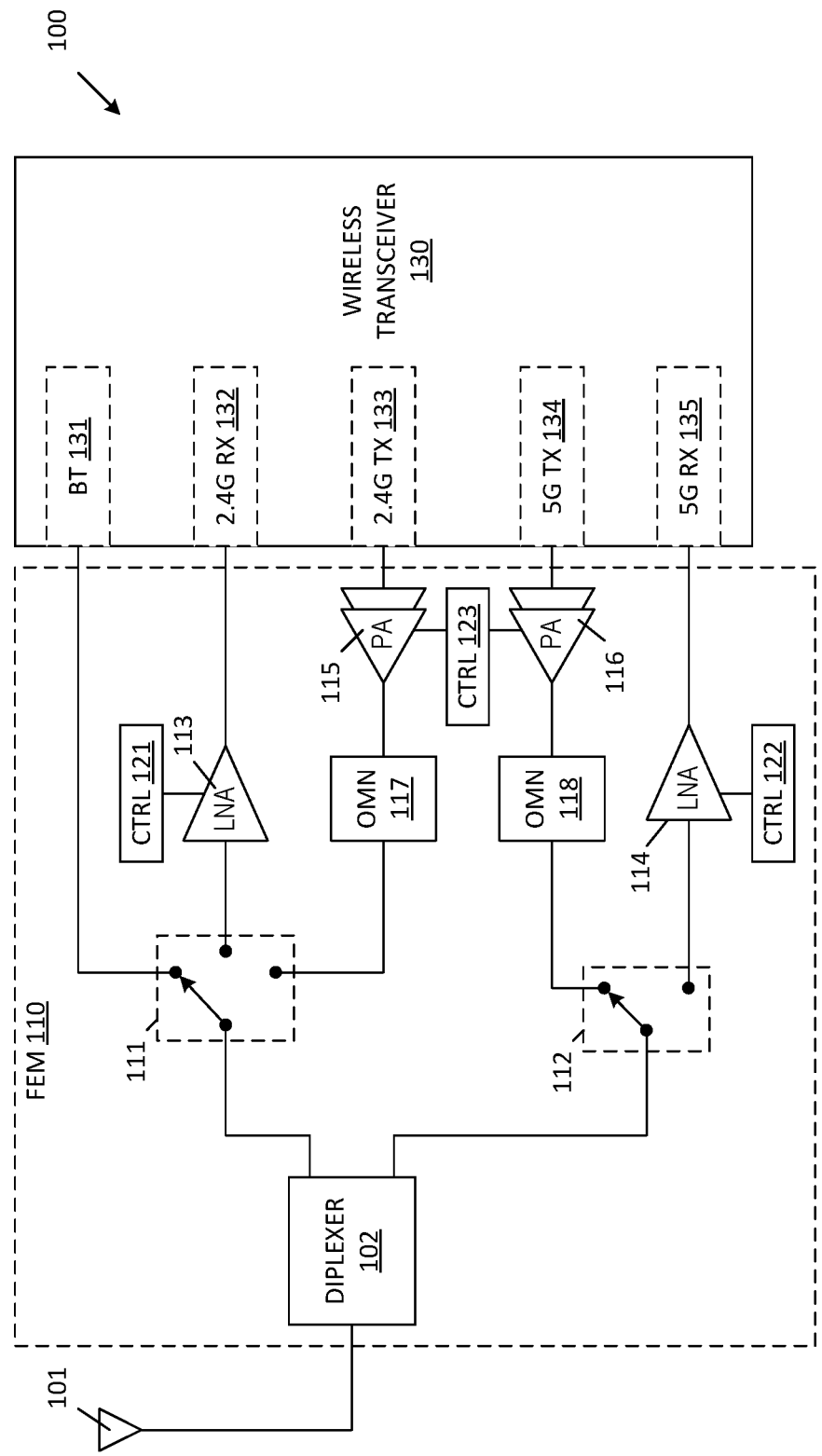
FIG. 1 is a block diagram of a conventional dual-band wireless communication device.

FIG. 3A is a cross sectional representation of a semiconductor structure 300 in accordance with one embodiment of the present invention. Semiconductor structure 300 is fabricated in accordance with a modified SiGe BiCMOS process in a manner described in more detail below. Semiconductor structure 300 includes an RF switch transistor 310, an isolation region 320, a 1.8V/5V CMOS transistor region 330 and an HBT region 340, which are fabricated on a high resistivity (HR) p-type semiconductor substrate 301. In one embodiment, p-type substrate 301 has a resistivity of about 500 Ω-cm or more. In one embodiment of the present invention, semiconductor structure 300 is used to implement an integrated FEM, which includes elements similar to those described above for FEM 110 (FIG. 1). That is, the RF switches 111-112 of FEM 110 can be implemented by structures corresponding with RF switch transistor 310. LNAs 113-114 and bias/control circuits 121-123 can be implemented with 1.8V and/or 5V CMOS transistors corresponding with those found in CMOS transistor region 330. Power amplifiers 115-116 can be implemented with SiGe HBTs corresponding with those found in HBT region 340.

Output impedance matching networks 117-118 can be implemented with resistors, capacitors, inductors and transmission lines (e.g., passive devices) fabricated over the structure of FIG. 3A. Structures similar to that found in isolation region 320 can be used to electrically isolate the various devices fabricated in substrate 301, as well as to electrically isolate the passive devices fabricated over the substrate 301 from the underlying substrate 301. Note that the passive devices benefit from the presence of an underlying high impedance substrate, whereby eddy currents induced in the underlying substrate are reduced, thereby enabling higher quality (lower loss) passive devices.

RF switch transistor 310 includes n-channel CMOS transistor structures 311-314, which are fabricated in a p-well 315, which in turn, is located in a deep n-well (DNW) 318. N-well regions 316-317 provide electrical contact from the upper surface to the deep n-well 318, as well as providing lateral junction isolation. RF switch transistor 310 is electrically isolated from adjacent circuitry by shallow trench isolation (STI) regions 351-352 and deep trench isolation (DTI) regions 361-362. Although RF switch transistor 310 is illustrated with four transistor structures 311-314, it is understood that other numbers of transistor structures can be used to implement RF switch transistor 310 in other embodiments. Moreover, although one RF switch transistor 310 is illustrated, it is understood that a plurality of RF switch transistors, identical to RF switch transistor 310, are typically connected in series to form an RF switch. In this case, each of the series-connected RF transistors can be completely separate and bordered by independent rings of deep trench isolation structures, or as adjacent transistors isolated by a common deep trench isolation structure. In addition, it is understood that other circuitry commonly associated with RF switch transistor 310 is not shown in FIG. 3A for clarity.

Isolation region 320 provides electrical isolation between various elements fabricated on high resistance substrate 301. In the illustrated embodiment, isolation region 320 provides isolation between RF switch transistor 310 and other circuit elements of semiconductor structure 300. Isolation region 320 includes shallow trench isolation regions 352-355, deep trench isolation regions 362-365, p--type regions 554-556, and n-type epitaxial regions 573-575. FIG. 3B is a top view of isolation region 320, which shows that the deep trench isolation regions 366-365 are configured to form a staggered grid pattern, when viewed from above. In one embodiment, the openings in the grid defined by the deep trench isolation regions 366-365 have dimensions of about 10 microns by 10 microns. Although STI regions 352-355 are not explicitly shown in FIG. 3B, it is understood that these STI regions exist everywhere within the grid of FIG. 3B, except for where the n-epi regions 573-575 are exposed at the upper surface of the substrate. The openings in the STI regions 352-355 (where the n-epi regions 573-575 are located) exist to provide adequate structural strength to the isolation region 320 due to limitations in the fabrication process. More specifically, the openings in the STI regions 352-355 prevent the adjacent active regions (e.g., n-type epitaxial regions 572 and 576-580 in FIG. 5E, below) from being over-polished and damaged during a chemical mechanical polishing (CMP) step used to form the STI regions 351-359. A regular occurrence of active regions helps the CMP pad polish in a uniform manner over the entire upper surface of the semiconductor structure while forming the STI regions 351-359. In one embodiment, each of the openings in the STI regions 352-355 has dimensions of about 1 micron by 1 micron, such that the area of each STI opening is about 1/100 of the area of the associated DTI grid opening.

The 1.8V/5V CMOS transistor region 330 includes conventional CMOS transistors 331-332, which can be designed to have operating voltages of either 1.8 Volts or 5 Volts. CMOS transistor 331 is an n-channel FET that is fabricated in p-well 333. CMOS transistor 332 is a p-channel FET that is fabricated in n-well 334 (which is located in p-well 333). Transistor region 330 is isolated from devices in the other regions 310, 320 and 340 of semiconductor structure 300 by shallow trench isolation regions 355-357 and deep trench isolation regions 365-366. Although only two transistors 331-332 are illustrated in transistor region 330, it is understood that many more transistors may be fabricated in this region. In general, transistors fabricated in region 330 are used to implement the LNAs and bias/control circuits of the associated FEM.

Bipolar transistor region 340 includes a SiGe NPN heterojunction bipolar transistor (HBT) 341. SiGe HBT 341 includes an n-type polysilicon emitter 342, a p-type silicon-germanium base layer 343, and a n-type silicon collector that includes n-type epitaxial silicon region 578, N+ buried region 345 and N+ collector contact region 344. As described in more detail below, p--regions 560-562 (which are a byproduct of the creation of p--regions 554-556) are located adjacent to the collector regions 344-345 and 578. Note that p--regions 560-562 do not significantly affect the operation of SiGe HBT 341. SiGe HBT 341 is isolated from the other regions 310, 320, 330 of semiconductor structure 300 by shallow trench isolation regions 357-359 and deep trench isolation regions 366-367.

Although only one SiGe HBT transistor 341 is shown in bipolar transistor region 340, it is understood that additional transistors can be fabricated in this region 340 (or other similar regions), and that the operating voltages of these transistors can be selected by design. For example, different bipolar transistors in region 340 can be designed have operating voltages of 6 Volts or 8 Volts. In general, the transistors fabricated in bipolar transistor region 340 are used to implement power amplifiers of an associated FEM.

As illustrated by FIGS. 3A and 3B, the p--regions 554-556 provide a relatively high resistance path near the upper surface of the substrate in the isolation region 320. The n-epi regions 573-575 have a relatively small layout area compared with the p--regions 554-556. In the example described above, each of the n-epi regions 573-575 has a layout area that is about 1% of the layout area of the corresponding surrounding p--region. As described in more detail below, the p--regions 554-556 are very lightly doped, and therefore exhibit a relatively high sheet resistance of about 50 KΩ/square. As a result, the combination of p--regions 554-556 and n-epi regions 573-575 have a high net resistance at the upper surface of the substrate. The combination of the deep trench isolation regions 362-365 and the high-resistivity p--regions 554-556 advantageously reduces the substrate losses of the semiconductor structure 300 (including the insertion losses in the RF switch 310).

In accordance with the present embodiment, n-epi regions 573-575 are dummy active regions (i.e., these regions 573-575 are defined at the same time as the active regions of semiconductor structure 300, but no devices are fabricated in these regions 573-575).

Although isolation region 320 includes a grid of deep trench isolation regions 362-365 in the embodiment illustrated by FIGS. 3A and 3B, it is possible to eliminate this grid in alternate embodiments. FIG. 3C is a cross sectional representation of a semiconductor structure 300A having an isolation region 320A that does not include a grid of deep trench isolation regions. Similar elements in semiconductor structure 300 (FIG. 3A) and semiconductor structure 300A (FIG. 3C) are labeled with similar reference numbers. In the illustrated embodiment, isolation region 320A provides isolation between RF switch transistor 310 and other circuit elements of semiconductor structure 300A. Isolation region 320A includes shallow trench isolation regions 352-355, deep trench isolation regions 362A and 365A, p--type region 555A, and n-type epitaxial regions 573-575. FIG. 3D is a top view of isolation region 320A, which includes the discrete deep trench isolation regions 362A and 365A, when viewed from above. Although STI regions 352-355 are not explicitly shown in FIG. 3D, it is understood that these STI regions exist between deep trench isolation regions 362A and 365A, except for where the n-epi regions 573-575 are exposed at the upper surface of the substrate. As described above, the openings in the STI regions 352-355 (where the n-epi regions 573-575 are located) exist to provide structural strength to the isolation region 320A, preventing adjacent active regions from being over-polished and damaged during the CMP step used to form the STI regions 351-359. P--type region 555A is formed in the same manner as p--type regions 554-556 (FIGS. 3A-3B). As a result, the p--region 555A is very lightly doped, and exhibits a relatively high sheet resistance of about 50 KΩ/square. As a result, the combination of p--region 555A and n-epi regions 573-575 advantageously exhibit a high net resistance at the upper surface of the substrate.

Figure 3E:
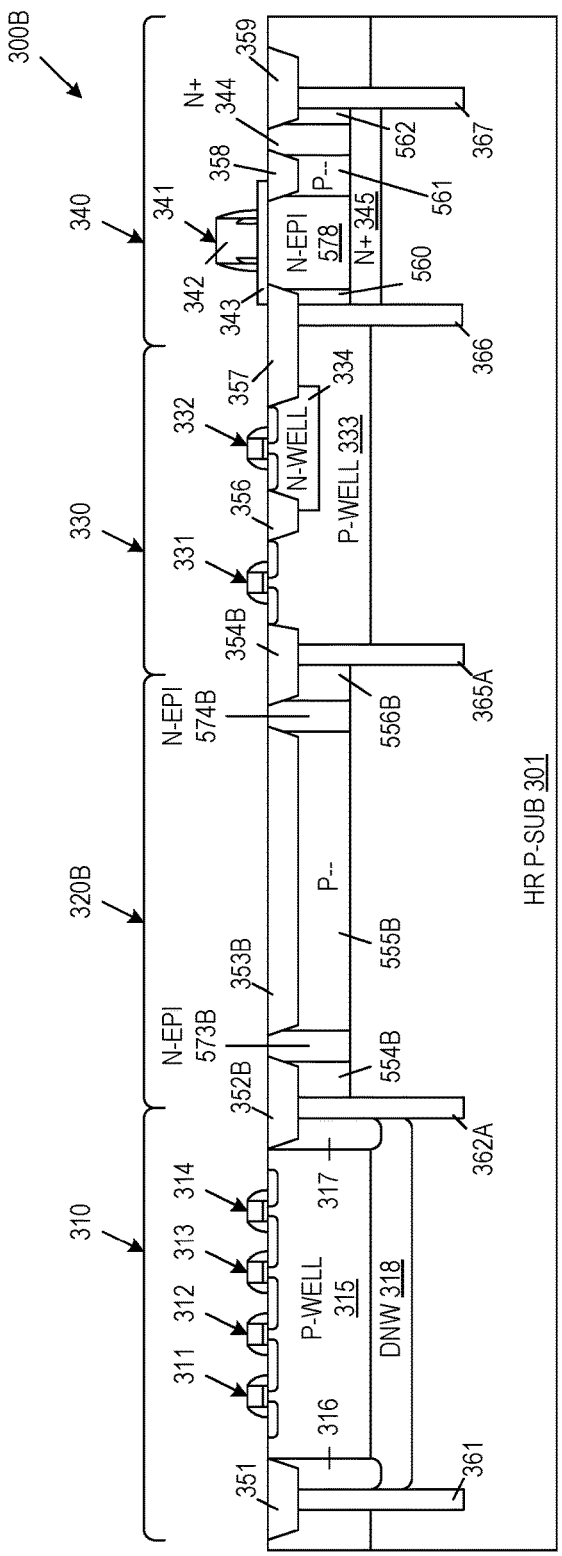
FIG. 3E is a cross sectional representation of a semiconductor structure fabricated using a modified SiGe BiCMOS process in accordance with another embodiment of the present invention.
Figure 3F:
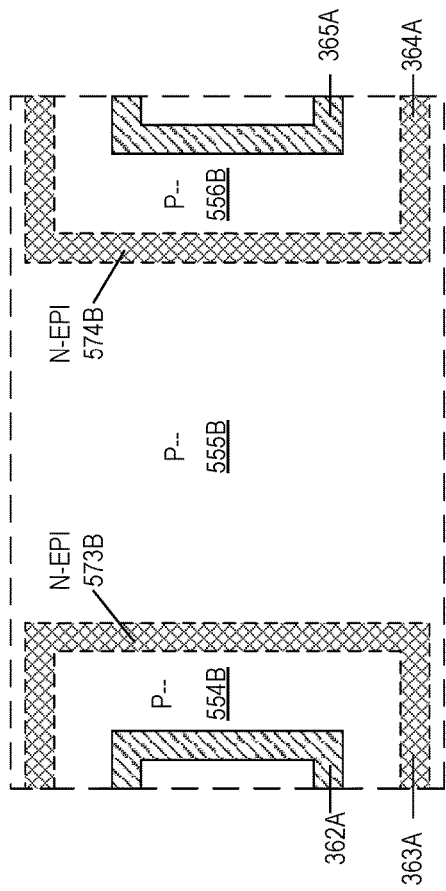
FIG. 3F is a top view of a portion of an isolation region of the semiconductor structure of FIG. 3F in accordance with one embodiment of the present invention.

FIGS. 3E and 3F illustrate another embodiment that eliminates the grid of deep trench isolation regions 362-365. FIG. 3E is a cross sectional representation of a semiconductor structure 300B having an isolation region 320B that does not include a grid of deep trench isolation regions. Similar elements in semiconductor structure 300 (FIG. 3A) and semiconductor structure 300B (FIG. 3E) are labeled with similar reference numbers. In the illustrated embodiment, isolation region 320B provides isolation between RF switch transistor 310 and other circuit elements of semiconductor structure 300B. Isolation region 320B includes shallow trench isolation regions 352B, 353B and 354B, deep trench isolation regions 362A and 365A, p--type regions 554B, 555B and 556B, and n-type epitaxial regions 573B and 574B. FIG. 3F is a top view of isolation region 320B, which includes the discrete deep trench isolation regions 362A and 365A, which have been described above in connection with FIGS. 3C and 3D. P--regions 554B and 556B laterally surround deep trench isolation regions 362A and 365A, respectively. N-type epitaxial regions 573B and 574B laterally surround p--regions 554B and 556B, respectively. P--region 555B is located between the n-type epitaxial regions 573B-574B. The n-type epitaxial regions 573B and 574B provide structural strength to the isolation region 320B, preventing adjacent active regions from being over-polished and damaged during the CMP step used to form the STI regions 351, 352B, 353B, 354B and 356-560. Although STI regions 352B, 353B and 354B are not explicitly shown in FIG. 3F, it is understood that these STI regions are generally located over the p--type regions 554B, 555B and 556B, respectively. P--type regions 554B-556B are formed in the same manner as p--type regions 554-556 (FIGS. 3A-3B). As a result, the p--regions 554B-556B are very lightly doped, and exhibit a relatively high sheet resistance of about 50 KΩ/square. Thus, the combination of p--regions 554B-556B and n-type epitaxial regions 573B-574B advantageously exhibit a high net resistance at the upper surface of the substrate.

Figure 2A:
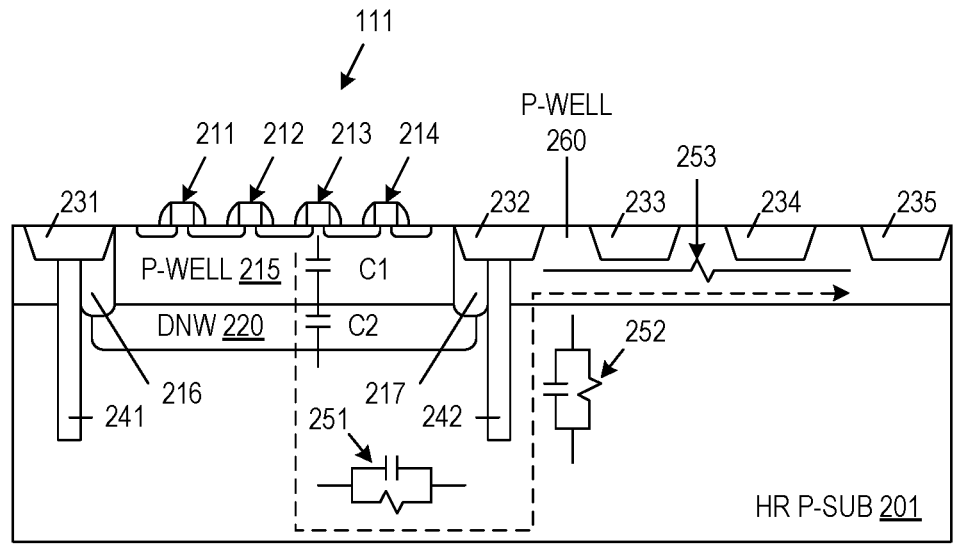
FIGS. 2A and 2B are cross sectional views of a multi-finger field effect transistor used to implement a radio frequency (RF) switch of the front end module of FIG. 1, when fabricated in accordance with a conventional SiGe BiCMOS process on a high-resistivity (HR) p-type substrate.
Figure 2B:
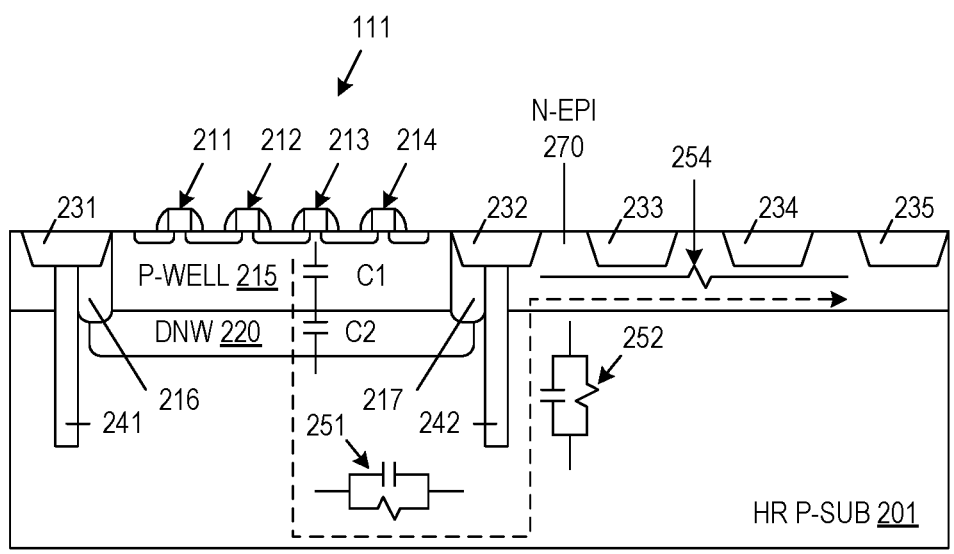
Figure 4:
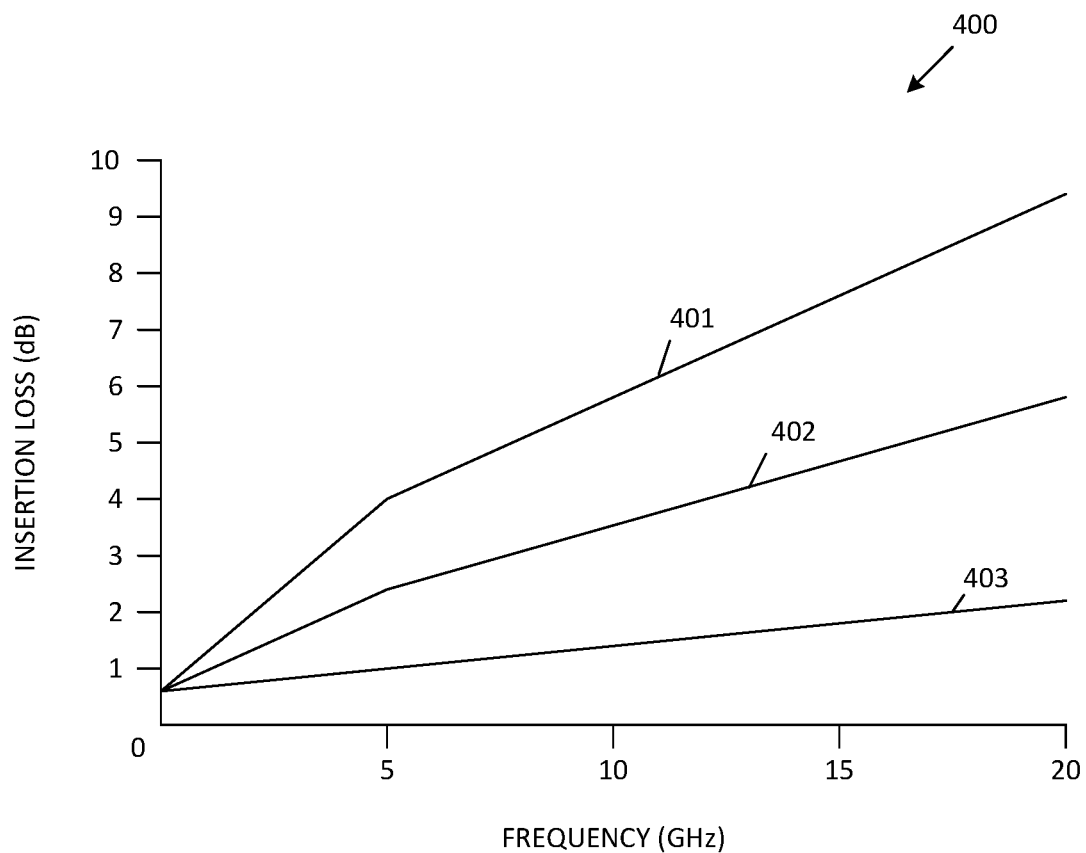
FIG. 4 is a graph illustrating insertion loss versus signal frequency for various isolation structures, including the isolation structure of FIGS. 3A-3B.

FIG. 4 is a graph 400 illustrating insertion loss (dB) versus frequency (GHz) for a signal applied to a 2 mm transmission line located above three different isolation structures. The first isolation structure, represented by curve 401, corresponds with the p-well 260, STI regions 232-235 and high-resistivity substrate 201, as illustrated by FIG. 2A. The second isolation structure, represented by curve 402, corresponds with the p--region 555A, n-type epi regions 573-575, STI regions 352-355, deep trench isolation regions 362A and 365A, and high-resistivity substrate 301, as illustrated by FIGS. 3C-3D. The third isolation structure, represented by curve 403, corresponds with the p--regions 554-556, n-type epi regions 573-575, STI regions 352-355, deep trench isolation regions 362-365 and high-resistivity substrate 301, as illustrated by FIGS. 3A-3B. As illustrated by graph 400, the inclusion of both the p--regions 554-556 and deep trench isolation regions 362-365 in the isolation structure significantly reduces the insertion loss in the associated semiconductor structure 300.

Figure 5C:
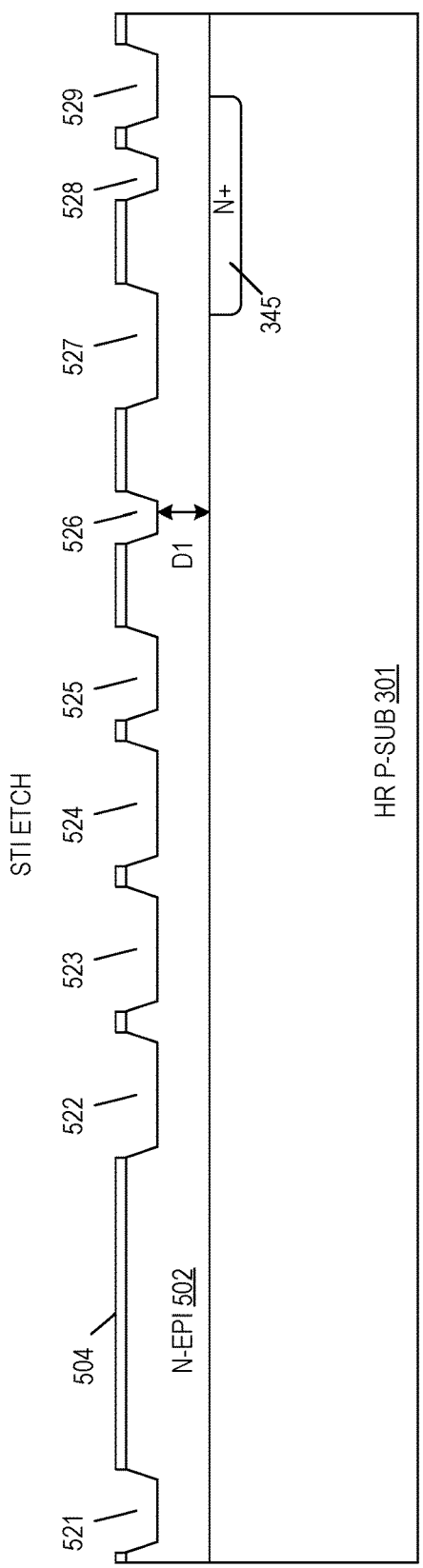

FIGS. 5A-5G are cross-sectional views of semiconductor structure 300 during various stages of fabrication in accordance with one modified SiGe BiCMOS process of the present invention. As illustrated by FIG. 5A, N+ region 345 is initially formed on the upper surface of high resistivity p-type substrate 301. In one embodiment, p-type substrate 301 is monocrystalline silicon having a resistivity of about 500 Ω-cm or more. As described above, N+ region 345 eventually forms a portion of the collector region of SiGe HBT 341.

As illustrated by FIG. 5B, an n-type epitaxial silicon layer 502 is then grown over the upper surface of substrate 301, using a method known to those of ordinary skill in the art. In one embodiment, n-type epitaxial layer 502 has a thickness of about 1.1 microns, and a dopant concentration of about $10^{16}$ cm$^3$. As a result, n-type epitaxial layer 502 is well suited to implement the collector region 578 of the SiGe HBT 341.

As illustrated in FIG. 5C, an active nitride hard mask 504 is formed over the upper surface of the resulting structure, wherein the mask 504 includes openings that define locations where shallow trench isolation (STI) regions 351-359 will be formed. In general, regions covered by mask 504 correspond with the active regions of the semiconductor structure 300 (i.e., regions where semiconductor devices will be fabricated). An etch is performed through the active nitride hard mask 504, thereby forming shallow trenches 521-529. In the described embodiment, each of the shallow trenches 521-529 has a depth of about 0.3 microns, such that the distance (D1) from the bottom of the shallow trenches to the bottom of the n-type epitaxial layer 502 is about 0.8 microns. Note that in the embodiment of FIGS. 3E and 3F, the active nitride hard mask 504 is modified to provide a pattern that includes openings where STI regions 351, 352B, 353B, 354B and 356-359 are to be formed.

Figure 5D:
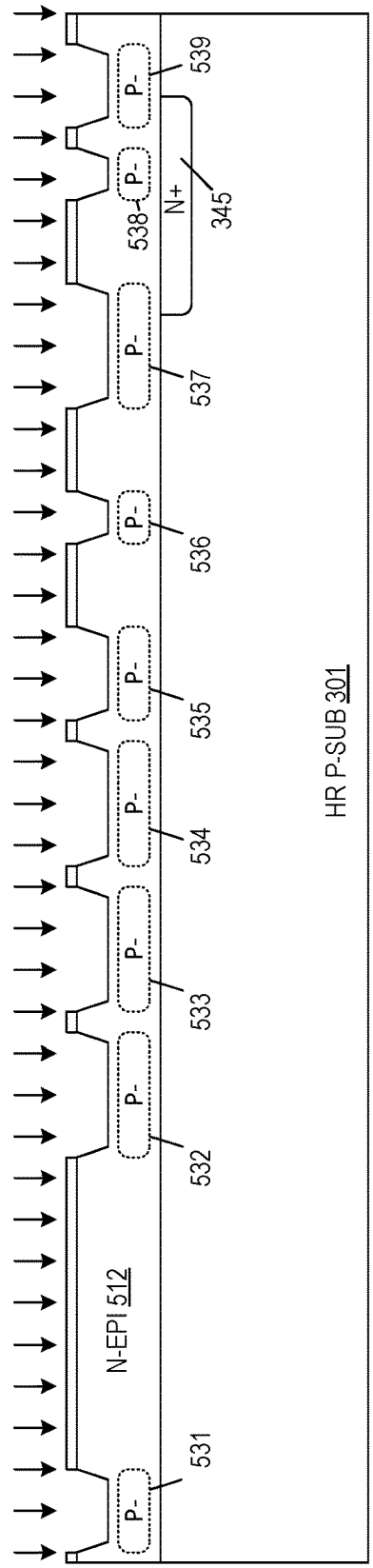

As illustrated in FIG. 5D, a p-type (p-) counter-doping implant 530 is then performed through mask 504. In accordance with one embodiment, boron is implanted at an energy of about 130 keV and a dosage of about $2 \times 10^{16}$ cm$^{-2}$. The energy of the counter-doping implant 530 is selected to target at about half the thickness of the exposed n-type epitaxial regions 511-518. Thus, in the illustrated example, the energy of the counter-doping implant 530 is selected to target a depth of about 0.4 microns (i.e., 0.8/2 microns). Thus, p-type dopant is implanted into regions 531-539 within the n-type epitaxial layer 502, as illustrated in FIG. 5D. Note that the various regions 531-539 may be continuous outside the view of FIG. 5D. The parameters of P-type implant 530 are selected to counter-dope the exposed portions of the n-type epitaxial layer 502, with the goals of providing regions having a low net doping (and therefore a high resistivity), and providing regions that are slightly p-type. In other embodiments, other implant conditions can be used to counter-dope the n-type epitaxial layer 502. For example, multiple implants at different energies and/or doses can be performed in series to achieve a flatter dopant profile over an extended range. Such multiple implants can beneficially tailor the p-type compensating dopant profile to match the dopant profile of the n-type epitaxial layer 502.

As illustrated by FIG. 5E, mask 504 is removed and a dielectric material (e.g., silicon oxide) is deposited over the resulting structure, and a CMP process is performed to remove the upper portions of the dielectric material, thereby forming shallow trench isolation regions 351-359 in shallow trenches 521-529. The exposed portions of the n-type epitaxial regions 573-573 at the upper surface of the substrate provide structural rigidity that prevents the over-polishing of the adjacent active regions, such as n-type epitaxial regions 571-572 and 576-580, during the CMP process. During this process (or during a subsequent process), the p-type impurities implanted in regions 531-539 are activated, thereby forming very lightly doped p--regions 541-549, and leaving n-type epitaxial regions 571-580. Again, the p--regions 541-549 may be continuous outside the view of FIG. 5E. As mentioned above, the p-type dopant concentration of the p-type counter-doping implant 530 is selected to be slightly greater than the n-type dopant concentration of the n-type epitaxial layer 502, such that resulting the p--type regions 541-549 have a net dopant concentration that is only slightly greater than an undoped region. As a result, the sheet resistance of p--regions 541-549 is relatively high (e.g., 50 KΩ/square or more). In one embodiment, the resistivity of p--regions 541-549 is approximately the same as the resistivity of p-type substrate 301. Note that while the substrate 301 has a uniform resistivity and the n-type epitaxial layer 502 has a fairly uniform resistivity, the counter-doped regions 541-549 may not exhibit a uniform resistivity due to the nature of the implant profiles. As a result, the resistivity of the counter-doped regions 541-549 may vary significantly with depth from the silicon surface. Thus, sheet resistance is used to provide the net lateral resistance of the entire region.

As illustrated by FIG. 5F, deep trench isolation regions 361-367 are formed. Deep trench isolation regions 361-367 extend through shallow trench isolation regions 351-355, 357 and 359, p--regions 541-545, 547 and 549, and into substrate 301. In one embodiment, each of deep trench isolation regions 361-367 is polysilicon encased with silicon dioxide having a width of about 1 μm and a depth of about 8 μm. As described above in connection with FIG. 3B, deep trench isolation regions 362-365 are configured in a staggered grid pattern in isolation region 320. In the alternate embodiments of FIGS. 3C-3D and 3E-3F, the deep trench isolation regions 362-365 are replaced with distinct deep trench isolation regions 362A and 365A. Deep trench isolation regions 361-367 divide the p--regions 541-549 to form p--regions 551-563, as illustrated. Deep trench isolation regions are fabricating using a process known to those of ordinary skill in the art.

Figure 5G:
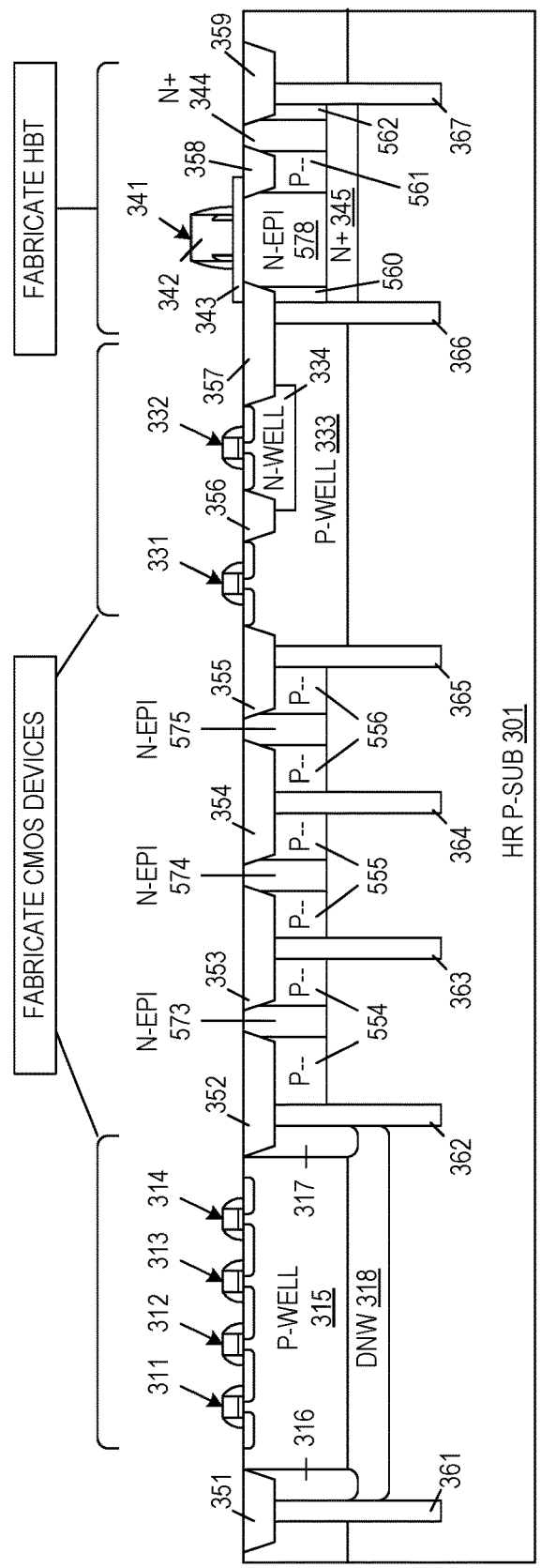

As illustrated in FIG. 5G, conventional SiGe BiCMOS process steps are then implemented to fabricate CMOS devices 311-314 and 331-332, and to fabricate SiGe HBT device 341. Note that the formation of p-well region 315, n-well regions 316-317 and deep n-well region 318 effectively replaces n-type epitaxial region 572 and p--regions 552-553. Similarly, p-well region 333 and n-well region 334 effectively replace n-type epitaxial regions 576-577 and p--regions 557-559.

Figure 6C:
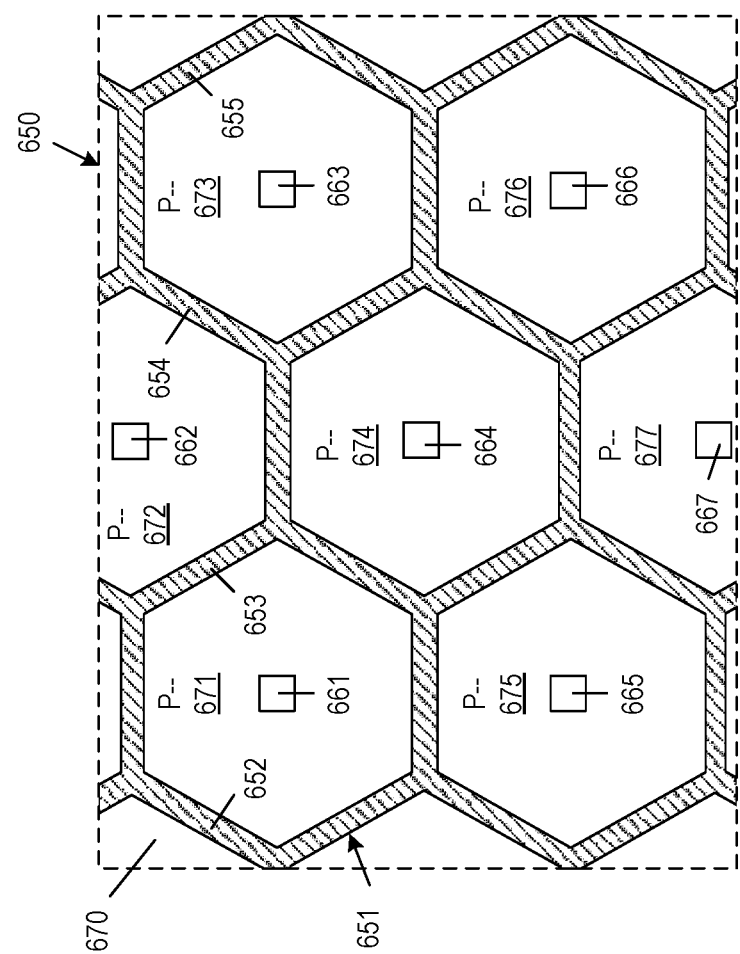
FIG. 6C is a top view of a portion of an isolation region of the semiconductor structures of FIGS. 3A and 6A in accordance with an alternate embodiment of the present invention.

FIG. 6A is a cross sectional representation of a semiconductor structure 600 in accordance with an alternate embodiment of the present invention. Semiconductor structure 600 is fabricated in accordance with a modified SiGe BiCMOS process in a manner described in more detail below. Because semiconductor structure 600 is similar to semiconductor structure 300, similar elements in FIGS. 6A and 3A are labeled with similar reference numbers. Thus, semiconductor structure 600 includes RF switch transistor 310 and 1.8V/5V CMOS transistor region 330, which are described above in connection with FIG. 3A.

Semiconductor structure 600 also includes an isolation region 620 and an HBT region 640, which are fabricated on the high resistivity (HR) p-type semiconductor substrate 301. Isolation region 620 provides electrical isolation between various elements fabricated on high resistance substrate 301 (in a similar manner to isolation region 320 of FIGS. 3A-3B). Isolation region 620 includes shallow trench isolation regions 352-355, deep trench isolation regions 362-365, and p--regions 610-612. FIG. 6B is a top view of isolation region 620, which includes the deep trench isolation regions 362-365 connected in a staggered grid in the manner described above in connection with FIG. 3B. Although STI regions 352-355 are not explicitly shown in FIG. 6B, it is understood that these STI regions exist everywhere within the grid, except for where the p--regions 610-612 are exposed at the upper surface of the substrate (as illustrated by the dashed squares labeled "STI openings 616-618" in FIGS. 6A and 6B). The openings 616-618 in the STI regions 352-355 exist to provide structural strength to the isolation region 620, thereby preventing over-polishing of adjacent active regions during the STI CMP process.

As illustrated by FIGS. 6A and 6B, the p--regions 610-612 provide a relatively high resistance path at the upper surface of the substrate in the isolation region 620. The combination of the deep trench isolation regions 362-365 and the high resistivity p--regions 610-612 advantageously reduces insertion losses in the RF switch 310. Note that isolation region 620 (unlike isolation region 320) does not include any n-type epitaxial regions. As a result, isolation region 620 may provide improved isolation with respect to isolation region 320.

Bipolar transistor region 640 includes a SiGe NPN heterojunction bipolar transistor (HBT) 641. SiGe HBT 641 is similar to SiGe HBT 341 (FIG. 3A). However, SiGe HBT 641 includes an n-type epitaxial collector region 624, which replaces the n-epi collector region 578 and p--regions 560-562 of SiGe HBT 341.

Although the isolation regions 320 and 620 illustrated by FIGS. 3A-3B and 6A-6B each includes a grid of deep trench isolation regions 362-365 arranged as a plurality of rectangles/squares, it is understood that these isolation regions can be arranged to include a grid of deep trench isolation regions composed of other polygonal shapes in other embodiments. For example, FIG. 6C is a top view of an isolation region 650 that includes a deep trench isolation grid 651 arranged as a plurality of hexagons. Deep trench isolation grid 651 includes deep trench isolation regions 652-655, which may roughly correspond with deep trench isolation regions 362-365 of isolation regions 320 and 620. Isolation region 650 includes STI openings 661-667, through which underlying n-type epitaxial regions (like the n-type epi regions 573-575 of isolation region 320) may be exposed. In an alternate embodiment, STI openings 661-667 may roughly correspond with STI openings 616-618 of isolation region 620. Shallow trench isolation region 670 is located everywhere within the isolation region 650, except where the STI openings 661-667 are located. P--regions 671-677, which roughly correspond with p--regions 554-556 of isolation region 320, or p--regions 610-612 of isolation region 620, are isolated by the deep trench isolation grid 651. Note that it is relatively easy to fabricate the isolation region 650 of FIG. 6C, due to the absence of 90 degree angles in the layout of the deep trench isolation grid 651.

Figure 6D:
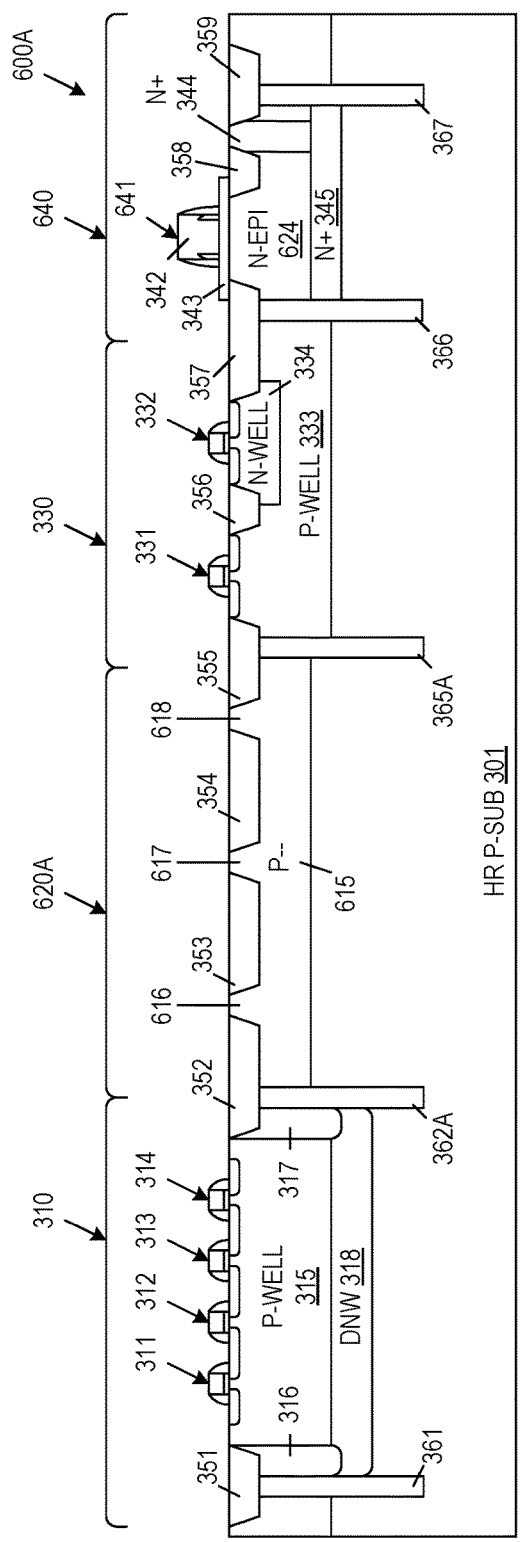
FIG. 6D is a cross sectional representation of a semiconductor structure fabricated using a modified SiGe BiCMOS process in accordance with an alternate embodiment of the present invention.
Figure 6E:
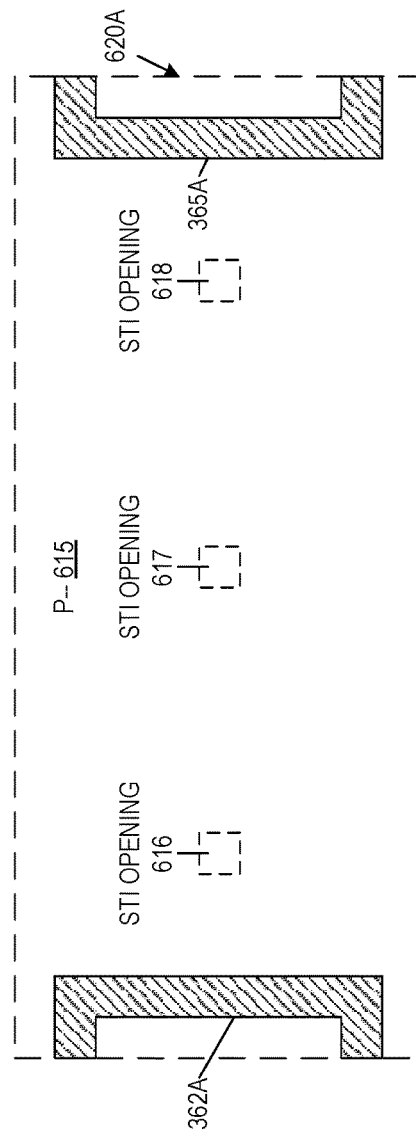
FIG. 6E is a top view of a portion of an isolation region of the semiconductor structure of FIG. 6D in accordance with one embodiment of the present invention.

Although isolation region 620 includes a grid of deep trench isolation regions 362-365 in the embodiment illustrated by FIGS. 6A and 6B, it is possible to eliminate this grid in the same manner described above in connection with FIGS. 3C and 3D. FIG. 6D is a cross sectional representation of a semiconductor structure 600A having an isolation region 620A that does not include a grid of deep trench isolation regions, but rather, includes a continuous p--type region 615 located between separate deep trench isolation regions 362A and 365A. Note that similar elements in semiconductor structure 600 (FIG. 6A) and semiconductor structure 600A (FIG. 6D) are labeled with similar reference numbers. FIG. 6E is a top view of isolation region 620A, which includes the discrete deep trench isolation regions 362A and 365A, when viewed from above. Although STI regions 352-355 are not explicitly shown in FIG. 6E, it is understood that these STI regions exist between deep trench isolation regions 362A and 365A, except for where the STI openings 616-618 are located at the upper surface of the substrate. As described above, the openings 616-618 in the STI regions 352-355 prevent over-polishing (and damaging) of the adjacent active regions during CMP of the STI regions 351-359.

FIGS. 6F and 6G illustrate another embodiment that eliminates the grid of deep trench isolation regions 362-365. FIG. 6F is a cross sectional representation of a semiconductor structure 600B having an isolation region 620B that does not include a grid of deep trench isolation regions. Similar elements in semiconductor structure 600 (FIG. 6A) and semiconductor structure 600B (FIG. 6F) are labeled with similar reference numbers. In the illustrated embodiment, isolation region 620B provides isolation between RF switch transistor 310 and other circuit elements of semiconductor structure 600B. Isolation region 620B includes shallow trench isolation regions 352B, 353B and 354B, deep trench isolation regions 362A and 365A, and p--type region 615. FIG. 6G is a top view of isolation region 620B, which includes the discrete deep trench isolation regions 362A and 365A, which have been described above in connection with FIG. 3F. P--region 615 laterally surrounds deep trench isolation regions 362A and 365A. P--region 615 is exposed through openings 616B and 617B of shallow trench isolation regions 352B, 353B and 354B. Edges of STI regions 352B, 353B and 354B are illustrated by FIG. 6G. Exposure of the P--region 615 through openings 616B and 617B advantageously prevents over-polishing (and damaging) of the adjacent active regions during CMP of the STI regions 351, 352B, 353B, 354B and 356-359. P--type region 615 advantageously exhibits a high net resistance at the upper surface of the substrate.

Figure 7C:
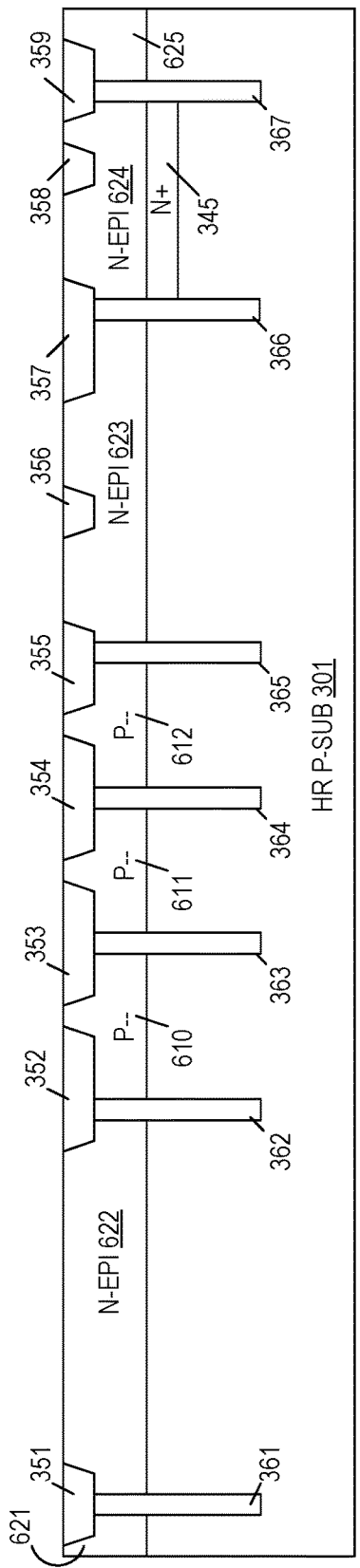

FIGS. 7A-7D are cross sectional views of semiconductor structure 600 during various stages of fabrication. As illustrated by FIG. 7A, N+ region 345 is initially formed on the upper surface of high resistivity p-type substrate 301, and n-type epitaxial silicon layer 502 is then grown over the upper surface of substrate 301 (resulting in the structure described above in connection with FIG. 5B). A counter-doping implant mask 601 is formed over the n-type epitaxial layer 502, wherein the mask 601 includes an opening that defines the location of isolation region 620. Note that counter-doping implant mask 601 represents an extra mask with respect to a conventional SiGe BiCMOS process node.

A p-type (p−) counter-doping implant 602 is performed through the opening of mask 601. In accordance with one embodiment, boron is implanted at an energy of about 180 keV and a dosage of about $2.5 \times 10^{16}$ cm$^{-3}$. The energy of the counter-doping implant 602 is selected to target at about half the thickness of the exposed n-type epitaxial layer 502. Thus, in the illustrated example, the energy of implant 602 is selected to target a depth of about 0.55 microns (i.e., (1.1)/2 microns). Thus, p-type dopant is implanted into region 605 within the n-type epitaxial layer 502, as illustrated in FIG. 7A. The parameters of P-type implant 602 are selected to counter dope the exposed portions of the n-type epitaxial layer 502, with the goals of providing regions having a low net doping (and therefore a high resistivity), and providing regions that are slightly p-type. In other embodiments, other implant conditions can be used to counter-dope the n-type epitaxial layer 502. As described above in connection with the counter-doping implant 530 of FIG. 5D, multiple implants at different energies and/or doses can be performed to tailor the p-type compensating dopant profile to match the dopant profile of the n-type epitaxial layer 502.

As illustrated by FIG. 7B, the p-type impurities implanted in region 605 are activated, thereby forming very lightly doped p−−region 609. Although the activation of the p-type impurities is illustrated as an independent step in FIG. 7B, it is understood that the activation of these p-type impurities may alternately occur later in the process (e.g., during anneals performed in accordance with the formation of subsequently formed structures). As mentioned above, the p-type dopant concentration of the p-type counter-doping implant 602 is selected to be slightly greater than the n-type dopant concentration of the n-type epitaxial layer 502, such that the p−−type region 609 has a net dopant concentration that is only slightly greater than an undoped region. As a result, the sheet resistance of p−−region 609 is relatively high (e.g., 50 KΩ/square or greater). In one embodiment, the resistivity of p−−region 609 is approximately the same as the resistivity of p-type substrate 301.

As illustrated in FIG. 7C, shallow trench isolation regions 351-359 are fabricated by etching STI region trenches through a mask, removing the mask, depositing a dielectric material (e.g., silicon oxide) over the resulting structure, and performing a CMP process to remove the upper portions of the dielectric material. Again, portions of the p−−region 609 exposed at the upper surface of the resulting structure provide structural rigidity that prevents the over-polishing of adjacent active regions during the CMP process. Note that to implement the alternate embodiment of FIGS. 6F-6G, the STI mask is modified to fabricate the STI regions 351, 352B, 353B, 354B, and 356-359.

Deep trench isolation regions 361-367 are formed through the shallow trench isolation regions 351-355, 357 and 359, as illustrated. Deep trench isolation regions 361-367 extend through n-type epitaxial layer 502 and p−−region 609 and into substrate 301, thereby dividing the non-counter-doped portions of n-type epitaxial layer 502 into n-type epitaxial regions 621-625, and dividing the lightly doped p−−region 609 into p−−regions 610-612. The structure of deep trench isolation regions 361-367 is described above in connection with FIG. 5F. Note that to implement the alternate embodiments of FIGS. 6D-6E and 6F-6G, the deep trench isolation regions 362-365 are replaced with the deep trench isolation regions 362A and 365A.

Figure 7D:
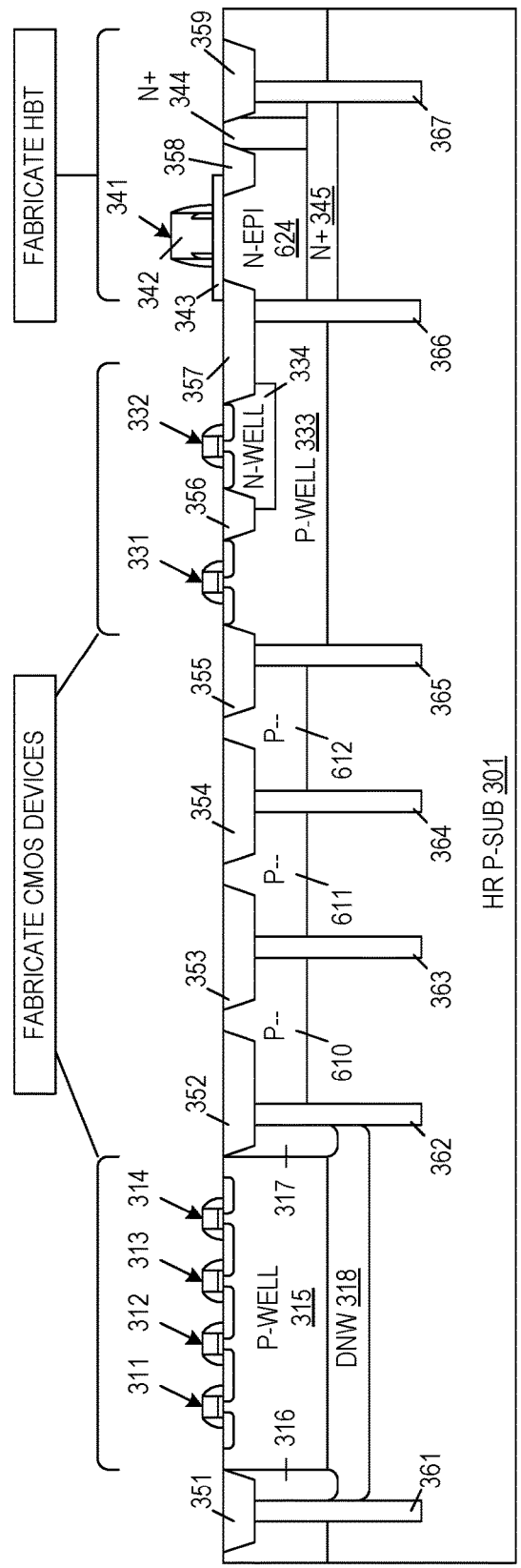

As illustrated in FIG. 7D, conventional SiGe BiCMOS process steps are implemented to fabricate CMOS devices 311-314 and 331-332, and to fabricate SiGe HBT device 641. Note that the formation of p-well region 315, n-well regions 316-317 and deep n-well region 318 effectively replaces n-type epitaxial region 622. Similarly, p-well region 333 and n-well region 334 effectively replace n-type epitaxial region 623.

In the manner described above, the isolation regions 320, 320A, 320B, 620, 620A and 620B can be fabricated with only slight modifications to a conventional SiGe BiCMOS process node. The improved isolation regions 320, 320A, 320B, 620, 620A and 620B allow for improved operation of a FEM fabricated on a single integrated circuit chip. Specific advantages provided by the improved isolation regions 320, 320A, 320B, 620, 620A and 620B of the present invention include the following. For passive devices such as MIM capacitors, inductors and transmission lines, energy loss due to capacitive coupling to the substrate are significantly reduced, enabling the passive devices to realize higher Q factors. The isolation regions 320, 320A, 320B, 620, 620A and 620B increase the impedance between nearby signal paths, reducing both cross-talk and signal loss to ground. This greatly reduces the insertion loss of devices such as coplanar waveguides and RF switch branches biased in the on-state, while increasing isolation across RF switch branches biased in the off-state.

In addition, the silicon regions outside of the active devices (i.e., the silicon regions in isolation regions 320, 320A, 320B, 620, 620A and 620B) become more linear. Although the impedance of any signal path through these isolation regions has been increased, some RF signals will still couple laterally through the substrate between ports of a circuit. However, by eliminating (or minimizing) the p-n junction between the n-type epitaxial layer and the underlying high-resistivity silicon substrate in the isolation regions 320, 320A, 320B, 620, 620A and 620B, this will contribute much less non-linearity to the RF circuits.

The benefits described above extend the frequency range for which BiCMOS technologies can provide competitive performance, enabling the design of single-chip RF systems for certain applications (e.g., front end modules).

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:
1. A semiconductor structure comprising:
  a semiconductor substrate having a first conductivity type;
  an epitaxial region formed over the semiconductor substrate, wherein the epitaxial region has a second conductivity type, opposite the first conductivity type, and wherein the epitaxial region forms a collector region of a heterojunction bipolar transistor; and
  an isolation region formed on the semiconductor substrate, wherein the isolation region includes:
  one or more shallow trench isolation regions;
  one or more deep trench isolation regions; and
  one or more lightly doped regions of the first conductivity type, each having a sheet resistance of at least about 50 KΩ/square.
2. The semiconductor structure of claim 1, wherein the semiconductor substrate has a resistivity of at least about 500 ohm-cm.

3. The semiconductor structure of claim 1, wherein the one or more lightly doped regions are located entirely below an upper surface of the semiconductor substrate.

4. The semiconductor structure of claim 1, wherein the epitaxial region has a sheet resistance of about 4 KΩ/square.

5. The semiconductor structure of claim 1, wherein the one or more deep trench isolation regions are arranged in a grid, wherein the one or more lightly doped regions are located within the grid.

6. The semiconductor structure of claim 1, further comprising a radio frequency (RF) switch fabricated in the semiconductor substrate adjacent to the isolation region, wherein the RF switch comprises a plurality of series-connected CMOS transistors.

7. The semiconductor structure of claim 1, wherein the heterojunction bipolar transistor is included in a power amplifier.

8. The semiconductor structure of claim 1, wherein there are one or more openings in the one or more shallow trench isolation regions that expose the one or more lightly doped regions of the first conductivity type.

9. The semiconductor structure of claim 1, wherein the isolation region further comprises one or more epitaxial regions having the second conductivity type.

10. The semiconductor structure of claim 9, wherein each of the one or more epitaxial regions is located within in an opening in the one or more shallow trench isolation regions.

11. The semiconductor structure of claim 5, wherein the isolation region further comprises one or more epitaxial regions having the second conductivity type, wherein each of the one or more epitaxial regions is located within an opening in the one or more shallow trench isolation regions.

12. The semiconductor structure of claim 11, wherein each of the one or more lightly doped regions located within the grid has a first layout area, and each of the one or more epitaxial regions has a second layout area, wherein the second layout area is about one percent of the first layout area.

13. The semiconductor structure of claim 11, wherein no devices are fabricated in the one or more epitaxial regions.

14. The semiconductor structure of claim 1, wherein the one or more deep trench isolation regions extend through the one or more shallow trench isolation regions.

15. The semiconductor structure of claim 5, wherein the grid is arranged as a plurality of rectangles.

16. The semiconductor structure of claim 5, wherein the grid is arranged as a plurality of hexagons.

17. The semiconductor structure comprising:
   a semiconductor substrate having a first conductivity type;
   a heterojunction bipolar transistor formed on the semiconductor substrate;
   a radio frequency switch transistor formed on the semiconductor substrate; and
   an isolation region formed on the semiconductor substrate, wherein the isolation region electrically isolates the heterojunction bipolar transistor from the radio frequency switch transistor, and where the isolation region includes:
      one or more shallow trench isolation regions;
      one or more deep trench isolation regions; and
      one or more lightly doped regions of the first conductivity type, each having a sheet resistance of at least about 50 KΩ/square.

18. The semiconductor structure of claim 17, wherein the one or more lightly doped regions are located entirely below an upper surface of the semiconductor substrate.

19. The semiconductor structure of claim 17, wherein the one or more deep trench isolation regions are arranged in a grid, wherein the one or more lightly doped regions are located within the grid.

20. The semiconductor structure of claim 17, wherein there are one or more openings in the one or more shallow trench isolation regions that expose the one or more lightly doped regions of the first conductivity type.

21. The semiconductor structure of claim 17, wherein the isolation region further comprises one or more epitaxial regions having a second conductivity type, opposite the first conductivity type, wherein each of the one or more epitaxial regions is located within in an opening in the one or more shallow trench isolation regions.

* * * * *